(12) United States Patent
Park et al.

(10) Patent No.: US 10,971,518 B2
(45) Date of Patent: Apr. 6, 2021

(54) THREE DIMENSIONAL SEMICONDUCTOR MEMORY DEVICES

(71) Applicant: Samsung Electronics Co., Ltd., Suwon-si (KR)

(72) Inventors: Jibong Park, Hwaseong-si (KR); Soyeon Kim, Seoul (KR); Hanyoung Lee, Anyang-si (KR); Young-Bae Yoon, Hwaseong-si (KR); Dongseog Eun, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/411,638

(22) Filed: May 14, 2019

(65) Prior Publication Data
US 2020/0105786 A1 Apr. 2, 2020

(30) Foreign Application Priority Data
Oct. 2, 2018 (KR) .................. 10-2018-0117630

(51) Int. Cl.
| H01L 27/11 | (2006.01) |
| H01L 27/11582 | (2017.01) |
| H01L 27/11565 | (2017.01) |
| H01L 27/1157 | (2017.01) |
| H01L 27/11573 | (2017.01) |
| H01L 27/11526 | (2017.01) |
| H01L 27/11556 | (2017.01) |

(Continued)

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11519* (2013.01); *H01L 27/11524* (2013.01); *H01L 27/11526* (2013.01); *H01L 27/11556* (2013.01)

(58) Field of Classification Search
CPC combination set(s) only.
See application file for complete search history.

(56) References Cited

U.S. PATENT DOCUMENTS 8,456,909 B2   6/2013   Lee et al.
8,492,831 B2   7/2013   Hwang et al.
(Continued)

FOREIGN PATENT DOCUMENTS

KR   100985882 B1   10/2010

*Primary Examiner* — Moin M Rahman
(74) *Attorney, Agent, or Firm* — Harness, Dickey & Pierce, P.L.C.

(57) ABSTRACT

A three-dimensional semiconductor memory device includes a substrate, an electrode structure including electrodes vertically stacked on the substrate and each having a pad portion, electrode separation structures penetrating the electrode structure and apart from each other in a second direction, and contact plugs coupled to the pad portions. The contact plugs comprise first contact plugs and second contact plugs apart in the second direction from the first contact plugs. The electrode separation structures comprise a first electrode separation between the first and second contact plugs. The first contact plugs are apart in the second direction at a first distance from the first electrode separation structure. The second contact plugs are apart in the second direction from the first electrode separation structure at a second distance, different from the first distance.

20 Claims, 18 Drawing Sheets

(51) Int. Cl.
*H01L 27/11519* (2017.01)
*H01L 27/11524* (2017.01)

(56) References Cited

U.S. PATENT DOCUMENTS

| | | |
|---|---|---|
| 9,356,034 B1 | 5/2016 | Yada et al. |
| 9,748,258 B2 | 8/2017 | Jeong et al. |
| 9,893,079 B2 | 2/2018 | Sonehara et al. |
| 2014/0197546 A1 | 7/2014 | Hwang et al. |
| 2015/0235939 A1* | 8/2015 | Lee .................. H01L 27/11573 257/774 |
| 2017/0250194 A1* | 8/2017 | Lee .................... H01L 27/1157 |

* cited by examiner

THREE DIMENSIONAL SEMICONDUCTOR MEMORY DEVICES

CROSS-REFERENCE TO RELATED APPLICATION

This U.S. nonprovisional application claims priority under 35 U.S.C § 119 to Korean Patent Application No. 10-2018-0117630 filed on Oct. 2, 2018 in the Korean Intellectual Property Office, the entire contents of which are hereby incorporated by reference.

BACKGROUND

The present inventive concepts relate to three-dimensional semiconductor memory devices, and more particularly, to three-dimensional semiconductor memory devices with enhanced reliability and increased integration.

Semiconductor devices have been highly integrated to meet higher performance and/or lower manufacturing cost which are required by customers. Because integration of the semiconductor devices is a factor in determining product price, higher integration is increasingly requested. Integration of typical two-dimensional or planar semiconductor devices is primarily determined by the area occupied by a unit memory cell, such that it is influenced by the level of technology for forming fine patterns. However, the processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide three-dimensional semiconductor memory devices with enhanced reliability and increased integration.

An aspect of the present inventive concepts is not limited to the mentioned above, and other aspects which have not been mentioned above will be clearly understood to those skilled in the art from the following description.

According to some example embodiments of the present inventive concepts, a three-dimensional semiconductor memory device may include a substrate including a cell array region and a connection region; an electrode structure including a plurality of electrodes vertically stacked on the substrate, each of the electrodes having a pad portion on the connection region; a plurality of electrode separation structures penetrating the electrode structure, the electrode separation structures extending in a first direction and spaced apart from each other in a second direction intersecting the first direction; and a plurality of contact plugs coupled to corresponding the pad portions of the electrodes. The contact plugs may include a plurality of first contact plugs along the first direction; and a plurality of second contact plugs apart in the second direction from the first contact plugs. The electrode separation structures may include a first electrode separation structure between the first contact plugs and the second contact plugs; a second electrode separation structure apart from the first electrode separation structure in the second direction, and the first contact plugs between the first and second electrode separation structures; and a third electrode separation structure apart from the first electrode separation structure in the second direction, and the second contact plugs between the first and third electrode separation structures. The first contact plugs may be apart in the second direction at a first distance from the first electrode separation structure, and apart from the second electrode separation structure at a second distance less than the first distance. The second contact plugs may be apart in the second direction from the first electrode separation structure at a third distance different from the first distance, and apart from the third electrode separation structure at a fourth distance less than the third distance.

According to some example embodiments of the present inventive concepts, a three-dimensional semiconductor memory device may include a substrate including a cell array region and a connection region; an electrode structure including a plurality of electrodes vertically stacked on the substrate, each of the electrodes having a pad portion on the connection region; an electrode separation structure penetrating the electrode structure and extending in a first direction; a plurality of contact plugs coupled to corresponding pad portions of the electrodes, the contact plugs including a first contact plug and a second contact plug apart in a second direction intersecting the first direction, the electrode separation structure between the first contact plug and the second contact plug; and a connection line group between the first contact plug and the second contact plug, the connection line group including a plurality of lower connection lines that extend in the first direction. The first contact plug may be apart in the second direction at a first distance from the electrode separation structure. The second contact plug may be apart from the electrode separation structure at a second distance different from the first distance.

According to some example embodiments of the present inventive concepts, a three-dimensional semiconductor memory device may include a substrate including a cell array region and a connection region; an electrode structure including a plurality of electrodes vertically stacked on the substrate, the electrode structure having on the connection region a plurality of first pad portions and a plurality of second pad portions; a plurality of first contact plugs along a first direction and coupled to corresponding first pad portions; a plurality of second contact plugs coupled to corresponding ones of second pad portions and apart in a second direction from the first contact plugs, the second direction intersecting the first direction; an electrode separation structure penetrating the electrode structure and extending along the first direction between the first contact plugs and the second contact plugs; a plurality of first dummy vertical structures penetrating corresponding first pad portions between the electrode separation structure and the first contact plugs; and a plurality of second dummy vertical structures penetrating corresponding second pad portions between the electrode separation structure and the second contact plugs. The first and second dummy vertical structures may be apart in the second direction at a first distance from the electrode separation structure. The first contact plugs may be apart in the second direction at a second direction from the electrode separation structure. The second contact plugs may be apart in the second direction from the second electrode separation structure at a third distance different from the second distance.

Details of other example embodiments are included in the description and drawings.

DETAILED DESCRIPTION OF EMBODIMENTS

The following will now describe some example embodiments of the present inventive concepts in conjunction with the accompanying drawings.

Figure 1:
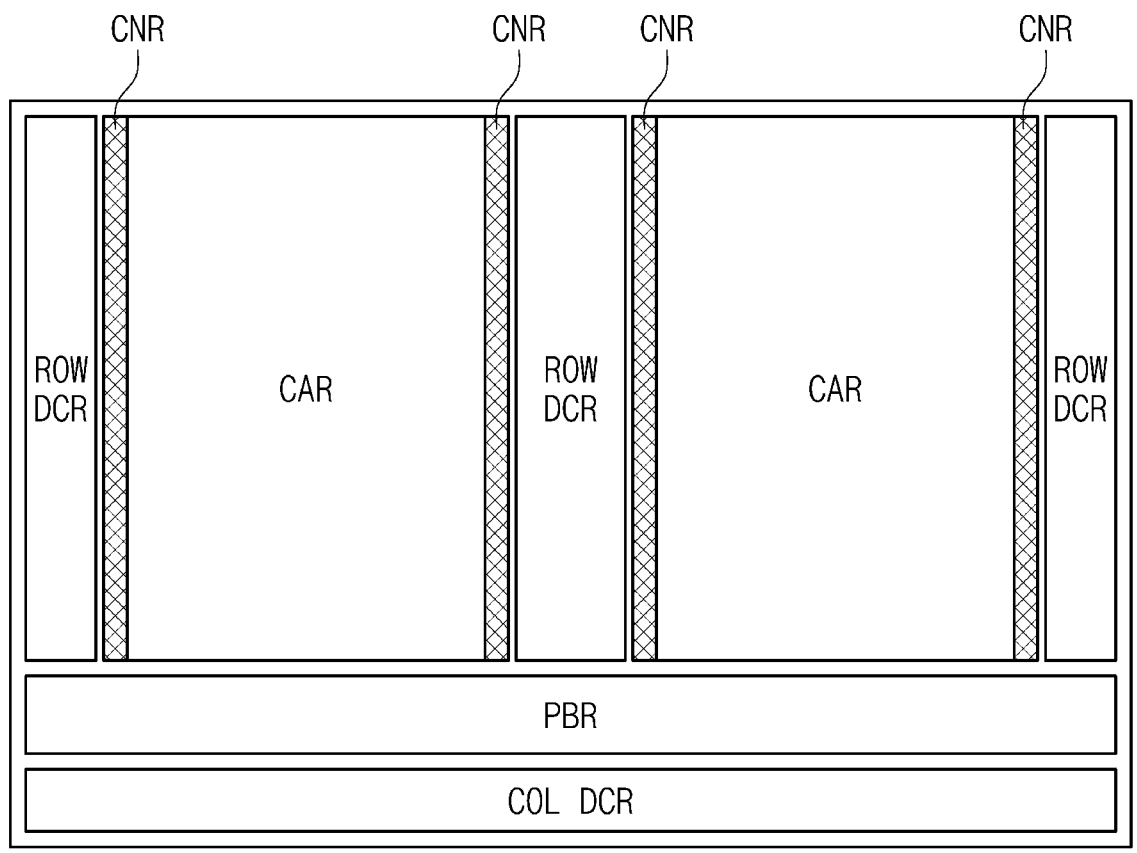
FIG. 1 illustrates a schematic diagram showing a simplified configuration of a three-dimensional semiconductor memory device according to some example embodiments of the present inventive concepts.

FIG. 1 illustrates a schematic diagram showing a simplified configuration of a three-dimensional semiconductor memory device according to some example embodiments of the present inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and/or a control circuit region (not shown). In some embodiments, connection regions CNR may be disposed between the cell array region CAR and the row decoder regions ROW DCR.

The cell array region CAR may include a memory cell array including a plurality of memory cells. In some embodiments, the memory cell array may include a plurality of memory blocks each of which is a data erase unit. Each of the memory blocks may include three-dimensionally arranged memory cells, a plurality of word lines electrically connected to the memory cells, and/or a plurality of bit lines electrically connected to the memory cells.

For example, the three-dimensional semiconductor memory device may be a vertical NAND Flash memory device, and the cell array region CAR may be provided with cell strings that are two-dimensionally arranged along first and second directions and extend in a third direction perpendicular to the first and second directions. Each of the cell strings may include string select transistors, memory cell transistors, and/or a ground select transistor that are connected in series. Each of the memory cell transistors may include a data storage element.

The connection region CNR may include a connection line structure (e.g., contact plugs and conductive lines) that electrically connects the memory cell array to a row decoder.

The row decoder region ROW DCR may include the row decoder that selects the word lines of the memory cell array. The row decoder may select one of the word lines of the memory cell array, based on address information. The row decoder may provide word line voltages to the selected word line and unselected word lines, in response to a control signal from a control circuit.

The page buffer region PBR may include a page buffer that reads data stored in the memory cells. Depending on an operating mode, the page buffer may temporarily store data to be stored in the memory cells or sense data stored in the memory cells. The page buffer may act as a write driver circuit in a program operating mode and as a sense amplifier circuit in a read operating mode.

The column decoder region COL DCR may include a column decoder connected to the bit lines of the memory cell array. The column decoder may provide a data transmission path between the page buffer and an external device (e.g., a memory controller).

Figure 2:
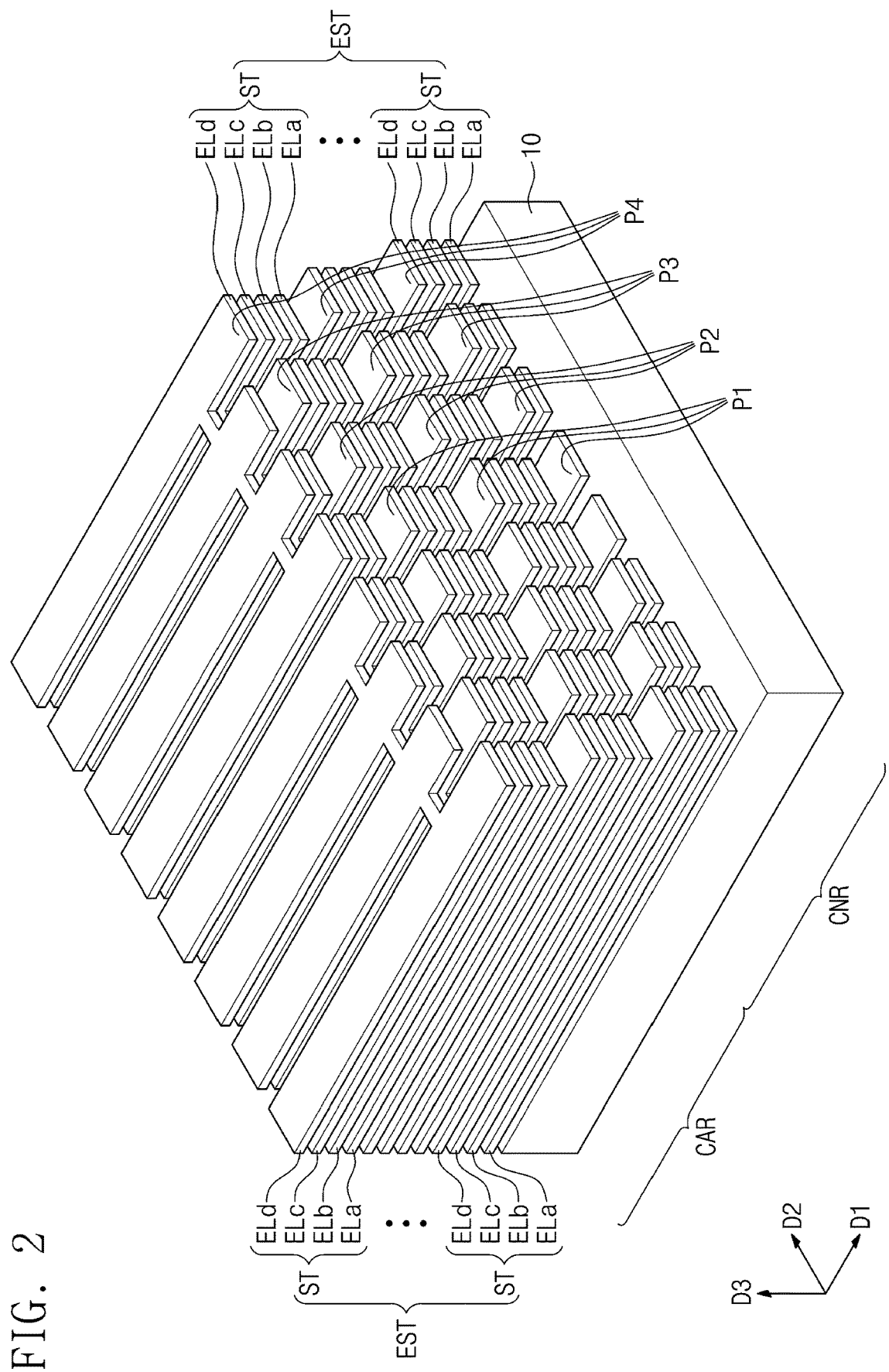
FIG. 2 illustrates a perspective view showing an electrode structure of a three-dimensional semiconductor memory device according to some example embodiments of the present inventive concepts.
Figure 3:
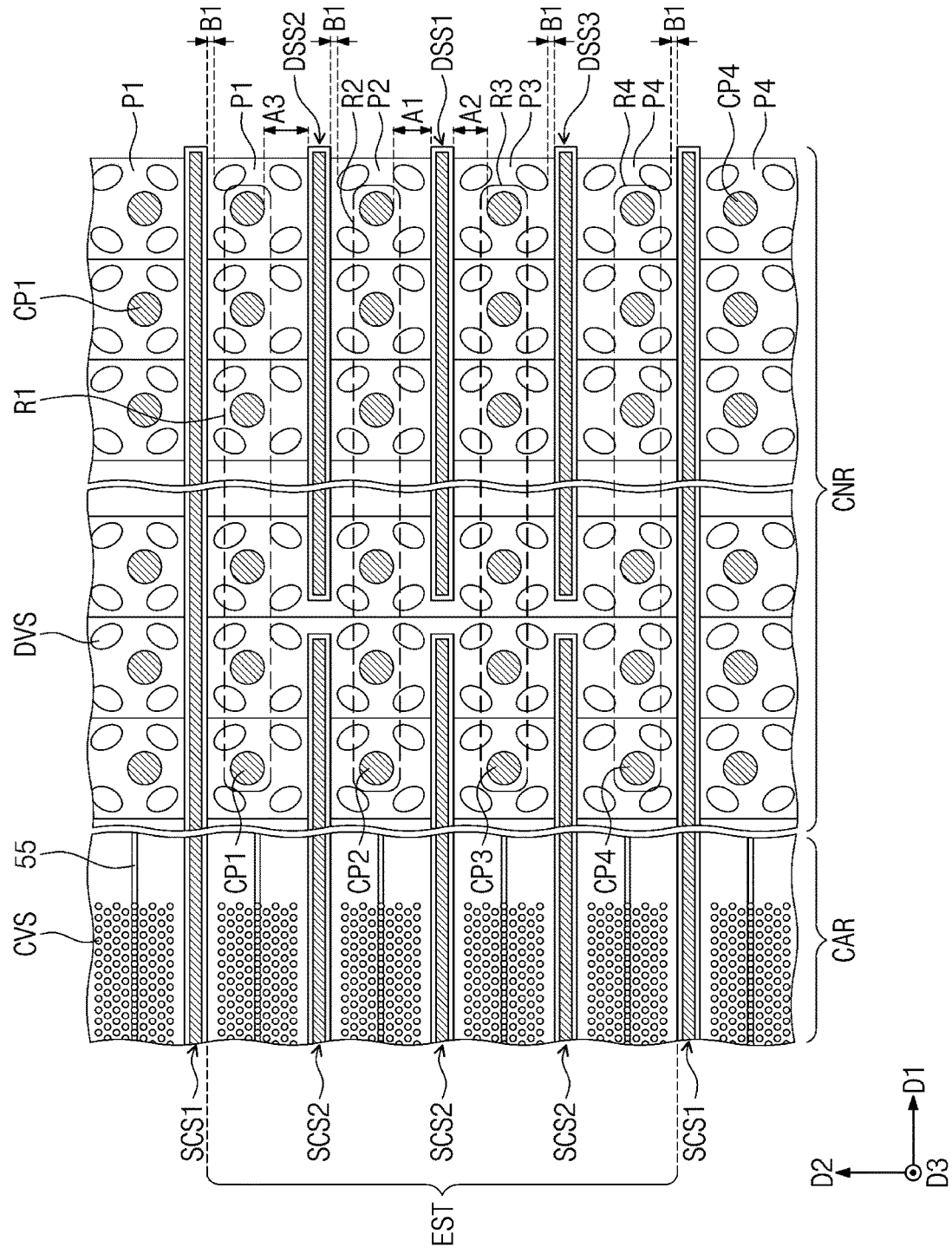
FIG. 3 illustrates a plan view showing contact plugs connected to an electrode structure of a three-dimensional semiconductor memory device according to some example embodiments of the present inventive concepts.
Figure 4:
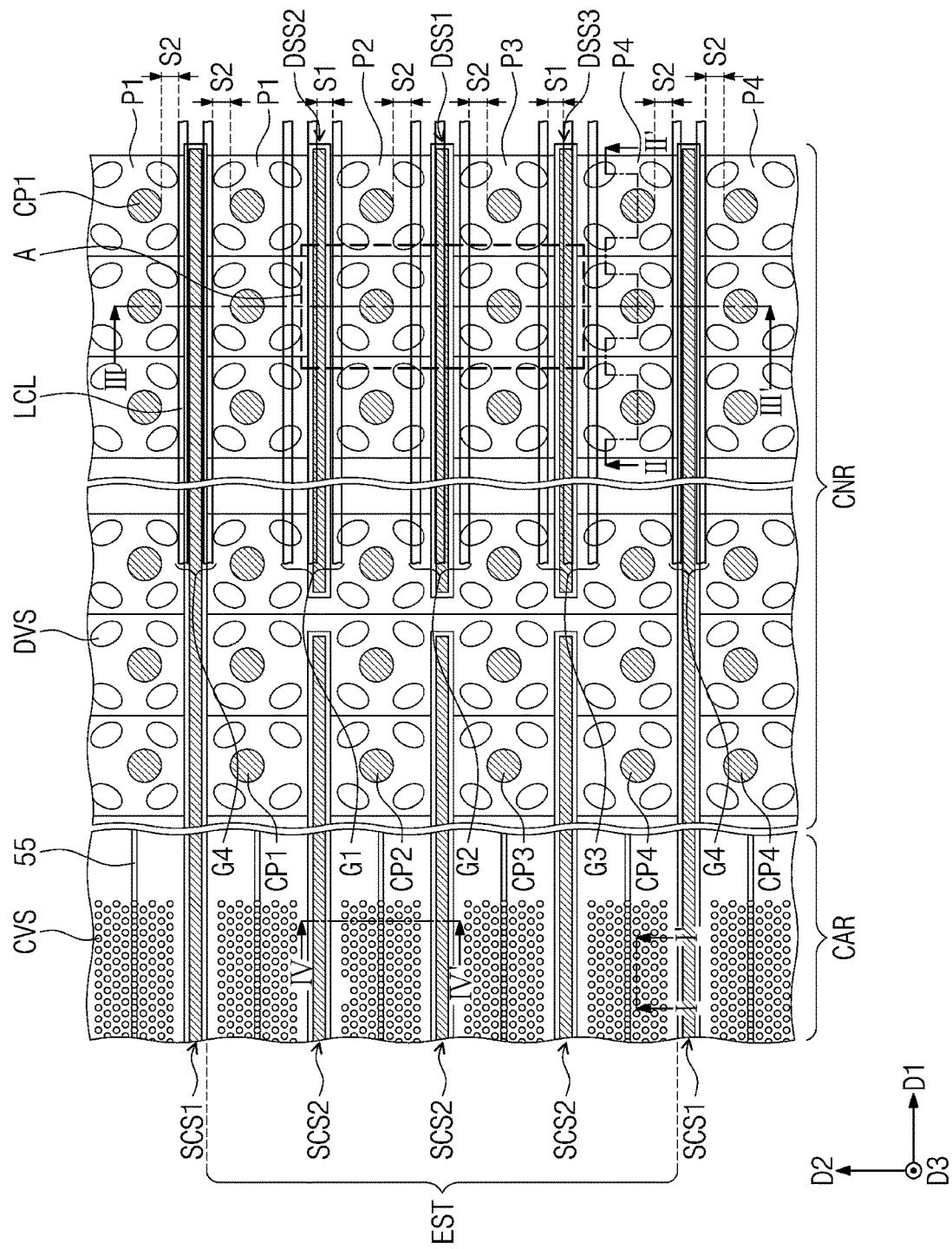
FIG. 4 illustrates a plan view showing lower connection lines coupled to an electrode structure of a three-dimensional semiconductor memory device according to some example embodiments of the present inventive concepts.
Figure 5A:
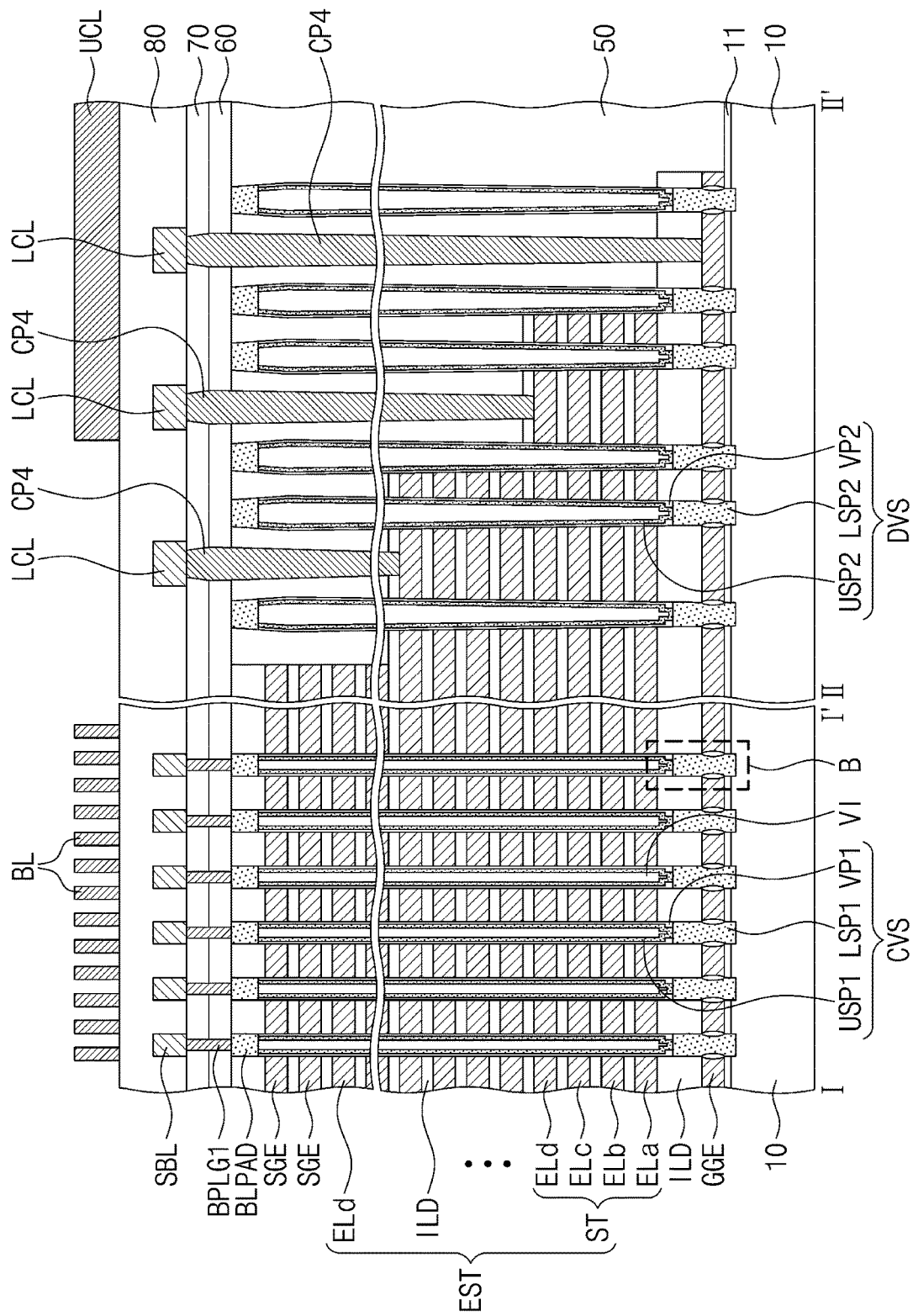
FIG. 5A illustrates a cross-sectional view taken along lines I-I' and II-II' of FIG. 4.
Figure 5B:
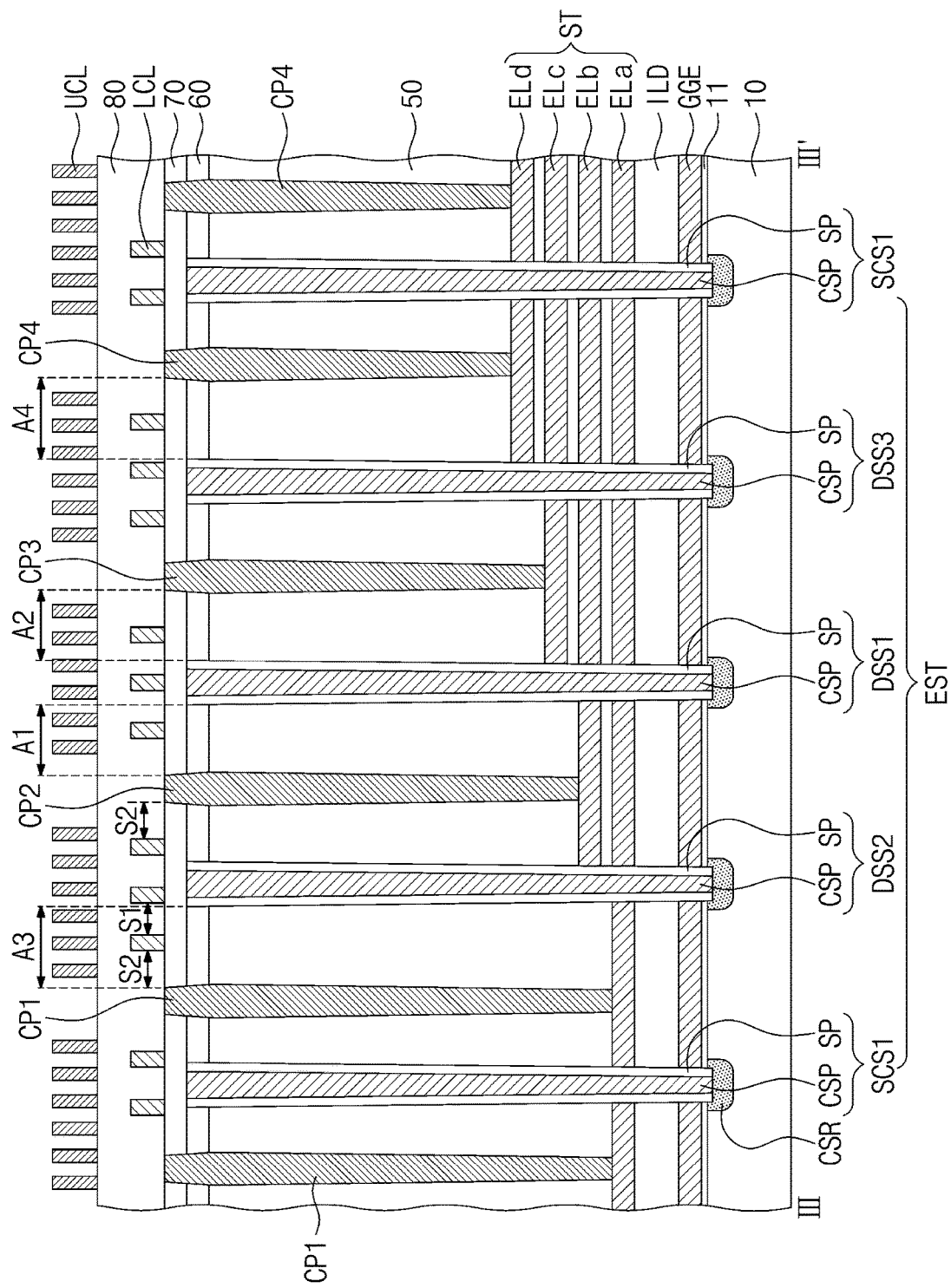
FIG. 5B illustrates a cross-sectional view taken along line III-III' of FIG. 4.
Figure 5C:
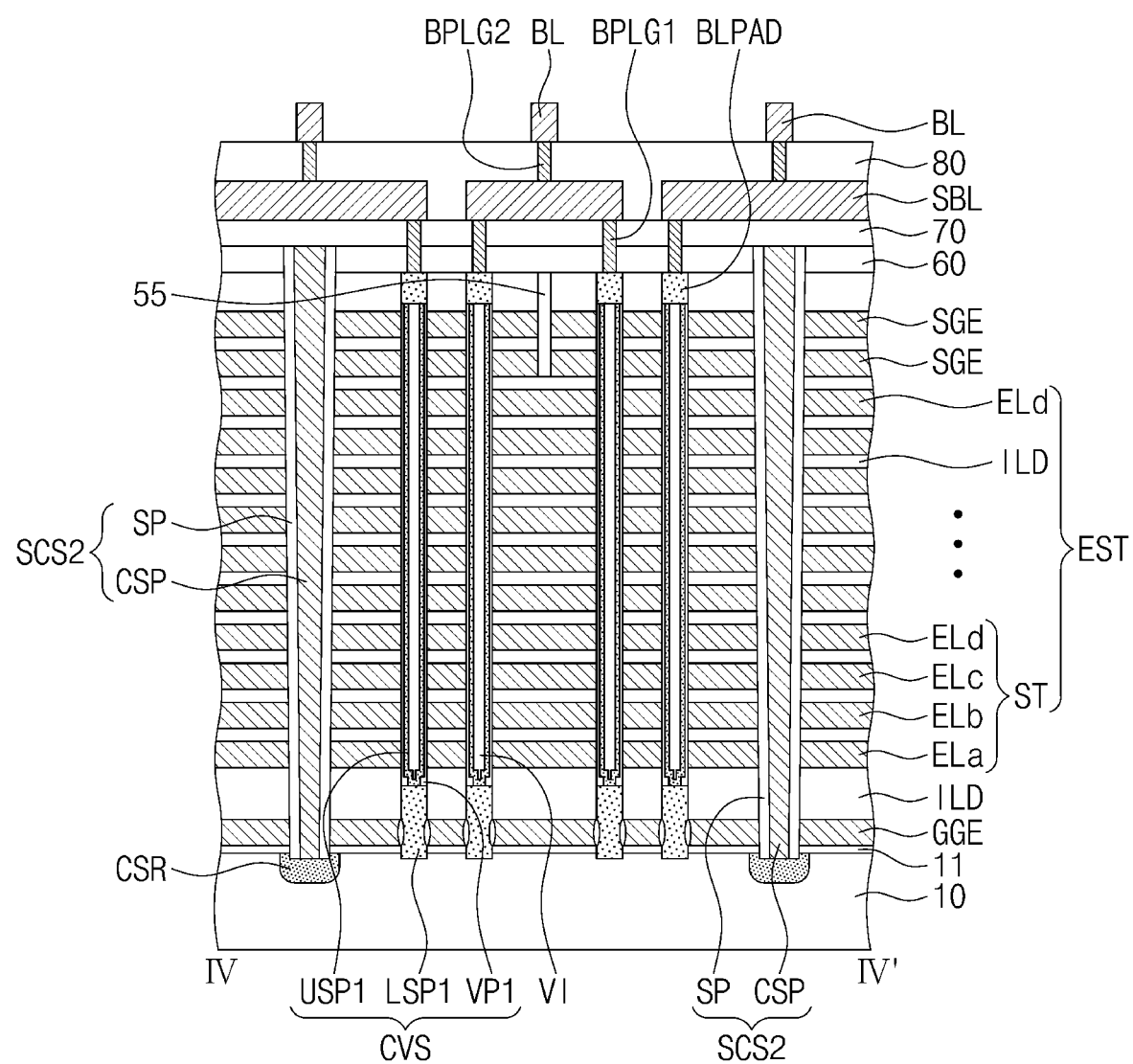
FIG. 5C illustrates a cross-sectional view taken along line IV-IV' of FIG. 4.
Figure 6:
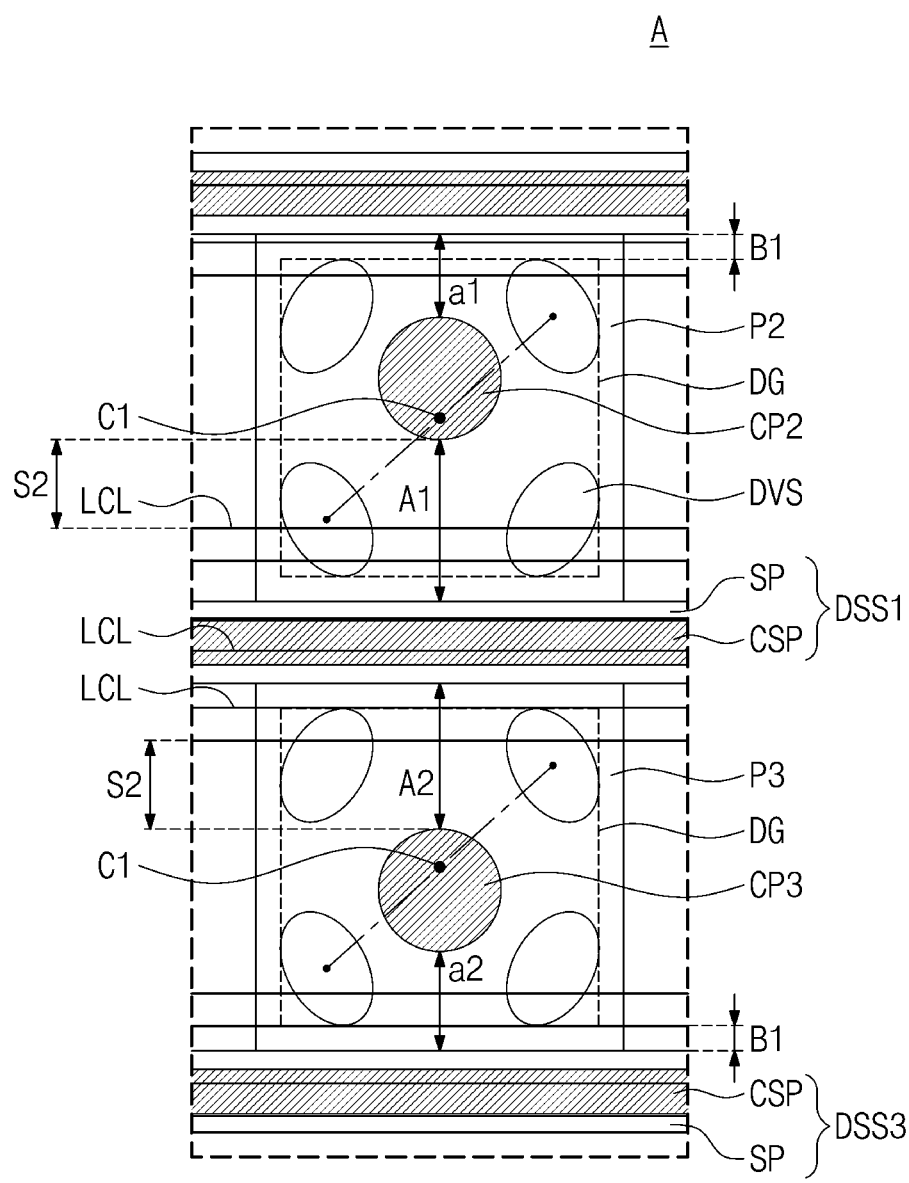
FIG. 6 illustrates an enlarged view showing section A of FIG. 4.
Figure 7A:
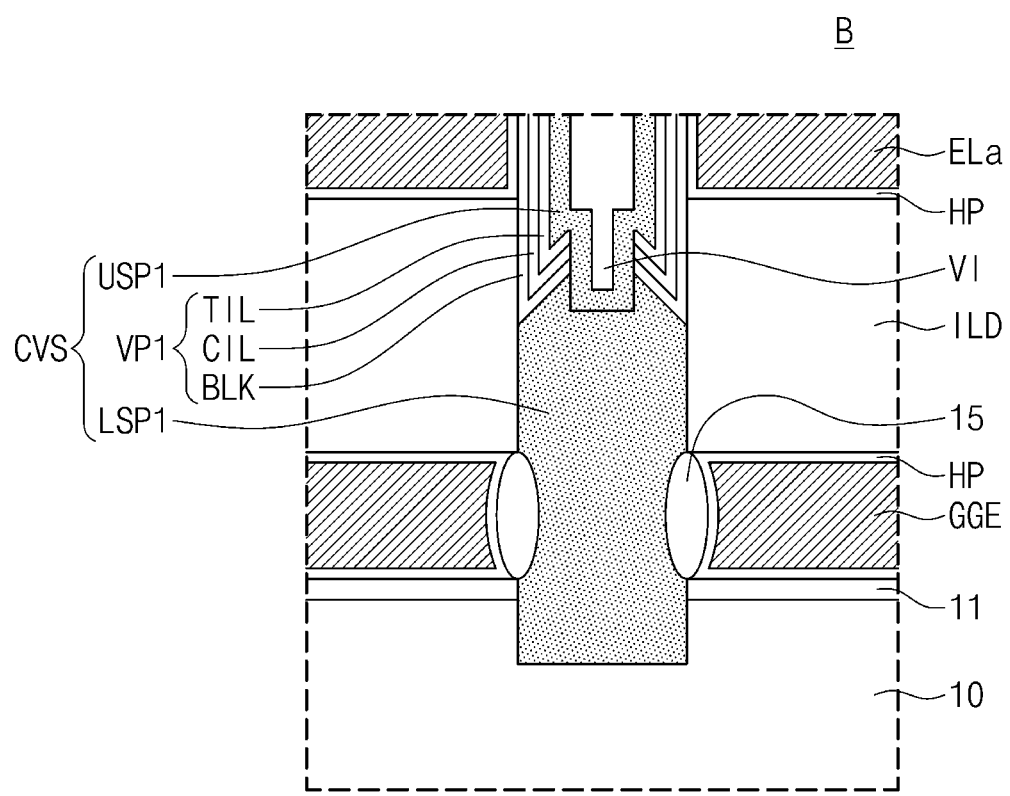
FIGS. 7A and 7B illustrate enlarged views showing section B of FIG. 5A.
Figure 7B:
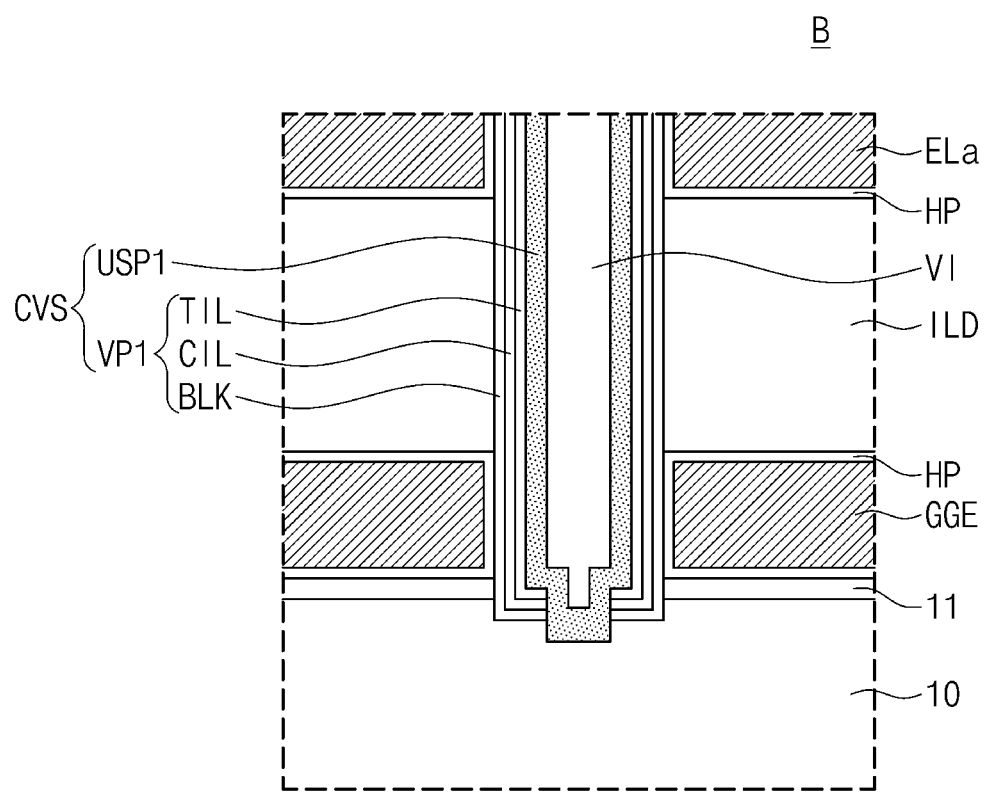

FIG. 2 illustrates a perspective view showing an electrode structure of a three-dimensional semiconductor memory device according to some example embodiments of the present inventive concepts. FIG. 3 illustrates a plan view showing contact plugs connected to an electrode structure of a three-dimensional semiconductor memory device according to some example embodiments of the present inventive concepts. FIG. 4 illustrates a plan view showing lower connection lines coupled to an electrode structure of a three-dimensional semiconductor memory device according to some example embodiments of the present inventive concepts. FIG. 5A illustrates a cross-sectional view taken along lines I-I' and II-II' of FIG. 4. FIG. 5B illustrates a cross-sectional view taken along line III-III' of FIG. 4. FIG. 5C illustrates a cross-sectional view taken along line IV-IV' of FIG. 4. FIG. 6 illustrates an enlarged view showing section A of FIG. 4. FIGS. 7A and 7B illustrate enlarged views showing section B of FIG. 5A.

Referring to FIGS. 2, 3, 4, 5A, 5B, and 5C, a substrate 10 may include a cell array region CAR on which memory cells are provided, and also include a connection region CNR to which are connected conductive lines and contact plugs coupled to the memory cells. The connection region CNR may be located around the cell array region CAR. In some embodiments, cell strings of a NAND Flash memory device may be integrated on the substrate 10 of the cell array region CAR.

The substrate 10 may include a semiconductor material including one or more of silicon (Si), germanium (Ge), and silicon-germanium (SiGe). The substrate 10 may have at least one selected from a single crystalline structure, an amorphous structure, and a polycrystalline structure.

On the substrate 10, electrode structures EST may extend along a first direction D1 from the cell array region CAR toward the connection region CNR. First electrode separation structures SCS1 may separate neighboring electrode structures EST from each other in a second direction D2 intersecting the first direction D1.

Each of the electrode structures EST may include dielectric layers ILD and electrodes ELa, ELb, ELc, and ELd that are alternately stacked along a third direction D3 (e.g., a vertical direction) perpendicular to the first and second directions D1 and D2. Each of the electrode structures EST may have a stepwise structure on the connection region CNR, and the electrodes ELa, ELb, ELc, and ELd may include respective pad portions P1, P2, P3, and P4 on the connection region CNR.

A ground select electrode GGE may be disposed between the electrode structure EST and the substrate 10, and string select electrodes SGE may be stacked on the electrode structure EST. The electrode structure EST may be provided thereon with a separation dielectric layer 55 that separates the string select electrodes SGE from each other in the second direction D2. The electrode structure EST and the substrate 10 may have therebetween a buffer dielectric layer 11, which includes a silicon oxide layer.

The electrodes ELa to ELd, the ground select electrode GGE, and the string select electrodes SGE may have substantially the same thickness, and the dielectric layers ILD may have their thicknesses that vary depending on characteristics of the three-dimensional semiconductor memory device. Each thickness of the dielectric layers ILD may be less than each thickness of the electrodes ELa to ELd, GGE, and SGE.

The electrodes ELa to ELd, the ground select electrode GGE, and the string select electrodes SGE may include a conductive material, such as one or more of doped semiconductor (e.g., doped silicon), metal (e.g., tungsten, copper, or aluminum), conductive metal nitride (e.g., titanium nitride or tantalum nitride), and transition metal (e.g., titanium or tantalum). The dielectric layers ILD may include, for example, a silicon oxide layer or a low-k dielectric layer.

Referring to FIG. 2, each of the electrode structures EST may include a plurality of stack structures ST that are vertically stacked on the substrate 10, each of which stacked structures ST may include first, second, third, and fourth electrodes ELa, ELb, ELc, and ELd that are sequentially stacked along the third direction D3. The stacked structures ST may have their lengths in the first direction D1 that decrease with increasing distance from the substrate 10.

In each of the stacked structures ST, the first, second, third, and fourth electrodes ELa, ELb, ELc, and ELd may include first, second, third, and fourth pad portions P1, P2, P3, and P4, respectively on the connection region CNR. The first to fourth pad portions P1 to P4 may be located at different levels from the substrate 10, and when viewed in plan, may be sequentially arranged along the second direction D2.

In each of the electrode structures EST, the first pad portions P1 of the first electrodes ELa may be located at different levels from the substrate 10, and when viewed in plan, may be arranged along the first direction D1. The above description about the first pad portions P1 of the first electrodes ELa may also be applicable to the second, third, and fourth pad portions P2, P3, and P4 of the second, third, and fourth electrodes ELb, ELc, and ELd. For example, when viewed in plan, the first to fourth pad portions P1 to P4 may be arranged in a matrix fashion along the first and second directions D1 and D2.

The pad portions P1 to P4 of the electrodes ELa to ELd included in one of the electrode structures EST may be disposed mirror-symmetrically to the pad portions P1 to P4 of the electrodes ELa to ELd included in an adjacent one of the electrode structures EST. For example, the first pad portions P1 may be adjacent to other in neighboring electrode structures EST, and the fourth pad portions P4 may be adjacent to each other in other neighboring electrode structures EST.

Referring to FIGS. 3, 4, 5A, 5B, and 5C, the connection region CNR may be provided thereon with a planarized dielectric layer 50 that covers the stepwise structures of the electrode structures EST. For example, the planarized dielectric layer 50 may cover the pad portions P1 to P4 of the electrodes ELa to ELd. The planarized dielectric layer 50 may have a substantially flat top surface and include a single dielectric layer or a plurality of stacked dielectric layers.

The cell array region CAR may be provided thereon with a plurality of cell vertical structures CVS that penetrate the string select electrodes SGE, the electrode structure EST, and the ground select electrode GGE and have connection with the substrate 10. The cell vertical structures CVS may be arranged in one direction or in a zigzag fashion when viewed in plan. The cell vertical structures CVS may have their circular top surfaces.

The cell vertical structures CVS may include a semiconductor material, such as silicon (Si), germanium (Ge), or a mixture thereof. The cell vertical structures CVS may include an impurity-doped semiconductor or an undoped intrinsic semiconductor. The cell vertical structures CVS including a semiconductor material may be used as channels of ground select, string select, and memory cell transistors that constitute a cell string of a vertical NAND Flash memory device.

Each of the cell vertical structures CVS may include a first lower semiconductor pattern LSP1, a first upper semiconductor pattern USP1, and/or a first vertical dielectric pattern VP1. A bit line contact pad BLPAD may be positioned on a top end of the first upper semiconductor pattern USP1. The bit line contact pad BLPAD may include an impurity-doped semiconductor material.

Referring to FIG. 7A, the first lower semiconductor pattern LSP1 may directly contact the substrate 10 and may include a pillar-shaped epitaxial layer grown from the substrate 10. The first lower semiconductor pattern LSP1 may include silicon (Si), germanium (Ge), silicon-germanium (Ge), a III-V group semiconductor compound, or a II-VI group semiconductor compound. A gate dielectric layer 15 may be disposed on a portion of a sidewall of the first lower semiconductor pattern LSP1. The gate dielectric layer 15 may be disposed between the ground select electrode GGE and the first lower semiconductor pattern LSP1. The gate dielectric layer 15 may include a silicon oxide layer (e.g., a thermal oxide layer). The gate dielectric layer 15 may have a rounded sidewall. Alternatively, the cell vertical structure CVS may have no first lower semiconductor pattern LSP1, and as shown in FIG. 7B, the first upper semiconductor pattern USP1 may directly contact the substrate 10.

Referring back to FIG. 7A, the first upper semiconductor pattern USP1 may directly contact one of the first lower semiconductor pattern LSP1 and the substrate 10, and may have a U shape or a pipe shape whose bottom end is closed. The first upper semiconductor pattern USP1 may have an inside filled with a first buried dielectric pattern VI including a dielectric material. The first upper semiconductor pattern USP1 may have a sidewall surrounded by the first vertical dielectric pattern VP1.

The first upper semiconductor pattern USP1 may include a semiconductor material, such as silicon (Si), germanium (Ge), or a mixture thereof. The first upper semiconductor pattern USP1 may have a different crystal structure from that of the first lower semiconductor pattern LSP1. For example, the first upper semiconductor pattern USP1 may have at least one selected from a single crystalline structure, an amorphous structure, and a polycrystalline structure.

In some embodiments, the first vertical dielectric pattern VP1 may include a tunnel dielectric layer TIL, a charge storage layer CIL, and/or a blocking dielectric layer BLK, which layers TIL, CIL, and BLK may constitute a data storage layer of a NAND Flash memory device. For example, the charge storage layer CIL may be a trap dielectric layer or a dielectric layer including a floating gate electrode or conductive nano-dots. For example, the charge storage layer CIL may include one or more of a silicon nitride layer, a silicon oxynitride layer, a silicon-rich nitride layer, a nano-crystalline silicon layer, and a laminated trap layer. The tunnel dielectric layer TIL may be one of materials having a band gap greater than that of the charge storage layer CIL, and the blocking dielectric layer BLK may be a high-k dielectric layer such as an aluminum oxide layer or a hafnium oxide layer. Alternatively, the first vertical dielectric pattern VP1 may include a thin layer for a phase change memory device or a variable resistance memory device.

Referring to FIGS. 7A and 7B, horizontal dielectric patterns HP may be provided between the first vertical dielectric pattern VP1 and sidewalls of the electrodes ELa to ELd. The horizontal dielectric patterns HP may extend onto top and bottom surfaces of the electrode ELa to ELd from the sidewalls of the electrodes ELa to ELd. The horizontal dielectric pattern HP may have a portion that extends onto top and bottom surfaces of the ground select electrode GGE from between the ground select electrode GGE and the gate dielectric layer 15 on a side of the first lower semiconductor pattern LSP1. The horizontal dielectric pattern HP may include a charge storage layer and a tunnel dielectric layer that serve as a component of a data storage layer of a NAND Flash memory device. Alternatively, the horizontal dielectric pattern HP may include a blocking dielectric layer.

Referring to FIGS. 3, 4, 5A, 5B, and 5C, the connection region CNR may be provided thereon with dummy vertical structures DVS that penetrate the planarized dielectric layer 50 and the electrode structure EST. The number of the electrodes ELa to ELd through which the dummy vertical structures DVS penetrate may decrease as the dummy vertical structures DVS become farther away from the cell array region CAR.

The dummy vertical structures DVS may include substantially the same stack structure and material as those of the cell vertical structures CVS. For example, each of the dummy vertical structures DVS may include a second lower semiconductor pattern LSP2, a second upper semiconductor pattern USP2, and/or a second vertical dielectric pattern VP2. The second lower semiconductor pattern LSP2 may include the same material as that of the first lower semiconductor pattern LSP1 of the cell vertical structure CVS. The second upper semiconductor pattern USP2 may include the same material as that of the first upper semiconductor pattern USP1 of the cell vertical structure CVS. The second vertical dielectric pattern VP2 may include the same material as that of the first vertical dielectric pattern VP1 of the cell vertical structure CVS. For example, the second vertical dielectric pattern VP2 may include a tunnel dielectric layer, a charge storage layer, and a blocking dielectric layer, which layers constitute a data storage layer of a NAND Flash memory device.

In some embodiments, the dummy vertical structures DVS may have substantially the same vertical length as that of the cell vertical structures CVS. For example, the dummy vertical structures DVS may have their top surfaces at substantially the same level as that of top surfaces of the cell vertical structures CVS. The dummy vertical structures DVS may have their widths greater than those of the cell vertical structures CVS. For example, the top surface of each of the dummy vertical structures DVS may have a bar or oval shape having major and minor axes.

A plurality of the dummy vertical structures DVS may penetrate each of the pad portions P1 to P4 of the electrodes ELa to ELd. For example, four dummy vertical structures DVS may penetrate each of the pad portions P1 to P4 of the electrodes ELa to ELd, but the present inventive concepts are not limited thereto. For another example, each of the pad portions P1 to P4 of the electrodes ELa to ELd may be penetrated by one, two, three, or five dummy vertical structures DVS. When viewed in plan, ones of the dummy vertical structures DVS may penetrate boundaries between the pad portions P1 to P4 of the electrodes ELa to ELd.

When viewed in plan, a plurality of the dummy vertical structures DVS penetrating each of the pad portions P1 to P4 of the electrodes ELa to ELd may be disposed to surround a corresponding one of contact plugs CP1, CP2, CP3, and CP4. On each of the pad portions P1 to P4, the dummy vertical structures DVS may have their major axes that are parallel to a diagonal direction to the first and second directions D1 and D2 and are disposed in different directions from each other.

Referring to FIG. 6, a plurality of the dummy vertical structures DVS penetrating each of the pad portions P1 to P4 may constitute a single dummy group DG, and each of the dummy groups DG may include, for example, four dummy vertical structures DVS. Each of the dummy groups DG may be spaced apart in the second direction D2 at a distance B1 from an adjacent one of electrode separation structures SCS1, DSS1, DSS2, and DSS3 which will be discussed below.

Referring to FIGS. 3, 4, 5A, 5B, and 5C, the planarized dielectric layer 50 may be provided thereon with a first interlayer dielectric layer 60 that covers the top surfaces of the cell vertical structures CVS and the top surfaces of the dummy vertical structures DVS.

First electrode separation structures SCS1, second electrode separation structures SCS2, and dummy electrode separation structures DSS1, DSS2, and DSS3 may penetrate the planarized dielectric layer 50 and the electrode structures EST.

The first electrode separation structures SCS1 may extend in the first direction D1 from the cell array region CAR toward the connection region CNR.

The second electrode separation structures SCS2 may extend in the first direction D1 on the cell array region CAR, and when viewed in plan, may lie between a pair of the first electrode separation structures SCS1. The second electrode separation structures SCS2 may be spaced apart from each other in the second direction D2 at an interval.

The dummy electrode separation structures DSS1, DSS2, and DSS3 may be spaced apart in the first direction D1 from the second electrode separation structures SCS2, and may extend in the first direction D1 on the connection region CNR. When viewed in plan, the dummy electrode separation structures DSS1, DSS2, and DSS3 may be spaced apart from each other at an interval between a pair of the first electrode separation structures SCS1.

Each of the electrode separation structures SCS1, SCS2, DSS1, DSS2, and DSS3 may include a common source plug CSP and a sidewall spacer SP that is between the electrode structure EST and a sidewall of the common source plug CSP. The common source plug CSP may be coupled to a common source region CSR formed in the substrate 10. For example, the common source plug CSP may have a substantially uniform upper width and may extend parallel to the first direction D1. The sidewall spacer SP may include a dielectric material, such as a silicon oxide layer.

The common source regions CSR may be formed by doping second conductivity impurities into the substrate 10 below the electrode separation structures SCS1, SCS2, DSS1, DSS2, and DSS3. The common source regions CSR may extend in the first direction D1 parallel to the electrode structures EST. The common source regions CSR may include, for example, n-type impurities (e.g., arsenic (As) or phosphorous (P)).

The first interlayer dielectric layer 60 may be provided thereon with a second interlayer dielectric layer 70 that covers top surfaces of the electrode separation structures SCS1, SCS2, DSS1, DSS2, and DSS3.

The cell array region CAR may be provided thereon with first bit line plugs BPLG1 that penetrate the first and second interlayer dielectric layers 60 and 70 and have connection with corresponding cell vertical structures CVS.

On the cell array region CAR, the second interlayer dielectric layer 70 may be provided thereon with subsidiary lines SBL whose major axes extend in the second direction D2. Each of the subsidiary lines SBL may be connected through the first bit line plugs BPLG1 to two cell vertical structures CVS.

On the connection region CNR, the contact plugs CP1 to CP4 may penetrate the first and second interlayer dielectric layers 60 and 70 and the planarized dielectric layer 50, and may be coupled to corresponding pad portions P1 to P4 of the electrodes ELa to ELd. The contact plugs CP1 to CP4 may have their vertical lengths that decrease with decreasing distance from the cell array region CAR. The contact plugs CP1 to CP4 may have their top surfaces substantially coplanar with each other.

When viewed in plan, each of the contact plugs CP1 to CP4 may be surrounded by and spaced apart from the dummy vertical structures DVS that penetrate a corresponding one of the pad portions P1 to P4. The top surfaces of the contact plugs CP1 to CP4 may be located at substantially the same level, and the vertical lengths of the contact plugs CP1 to CP4 may be different from each other. The top surfaces of the contact plugs CP1 to CP4 may be located at a higher level than that of the top surfaces of the dummy vertical structures DVS and that of the top surfaces of the electrode separation structures SCS1, SCS2, DSS1, DSS2, and DSS3.

Referring to FIG. 6, a single one of the contact plugs CP1 to CP4 coupled to corresponding pad portions P1 to P4 may be positioned at different distances from the dummy vertical structures DVS that surround the single one of the contact plugs CP1 to CP4. For example, a single one of the contact plugs CP1 to CP4 may be disposed to deviate from a central point C1 spaced at the same distance from the dummy vertical structures DVS diagonally disposed across the single one of the contact plugs CP1 to CP4.

Referring to FIGS. 3, 5A, and 5B, the contact plugs CP1 to CP4 may include first contact plugs CP1 coupled to the first pad portions P1 of the first electrodes ELa, second contact plugs CP2 coupled to the second pad portions P2 of the second electrodes ELb, third contact plugs CP3 coupled to the third pad portions P3 of the third electrodes ELc, and fourth contact plugs CP4 coupled to the fourth pad portions P4 of the fourth electrode ELd.

Likewise the arrangement of the first to fourth pad portions P1 to P4 as discussed above, when viewed in plan, the first to fourth contact plugs CP1 to CP4 may also be arranged along the first and second directions D1 and D2. For example, the first contact plugs CP1 may be arranged along the first direction D1 to constitute a first row R1, and the second contact plugs CP2 may be arranged along the first direction D1 to constitute a second row R2. The third contact plugs CP3 may be arranged along the first direction D1 to constitute a third row R3, and the fourth contact plugs CP4 may be arranged along the first direction D1 to constitute a fourth row R4. The first to fourth rows R1 to R4 may be spaced apart from each other in the second direction D2.

In some embodiments, the first dummy electrode separation structure DSS1 may be disposed between the second row R2 of the second contact plugs CP2 and the third row R3 of the third contact plugs CP3. The second row R2 of the second contact plugs CP2 may be spaced apart in the second direction D2 at a first distance A1 from the first dummy electrode separation structure DSS1, and the third row R3 of the third contact plugs CP3 may be spaced apart in the second direction D2 at a second distance A2 from the first dummy electrode structure DSS1. The second distance A2 may be different from the first distance A1. For example, the second distance A2 may be less than the first distance A1. In addition, the second row R2 of the second contact plugs CP2 may be spaced apart in the second direction D2 from the second dummy electrode separation structure DSS2 at a third distance A3 less than the first distance A1. The third row R3 of the third contact plugs CP3 may be spaced apart in the second direction D2 from the second dummy electrode separation structure DSS2 at a fourth distance a2 less than the second distance A2.

The first row R1 of the first contact plugs CP1 may be disposed between the first electrode separation structure SCS1 and the second dummy electrode separation structure DSS2, and the fourth row R4 of the fourth contact plugs CP4 may be disposed between the first electrode separation structure SCS1 and the third dummy electrode separation structure DSS3.

The first row R1 of the first contact plugs CP1 may be spaced apart in the second direction D2 at a fifth distance A3 from the second dummy electrode separation structure DSS2, and the fourth row R4 of the fourth contact plugs CP4 may be spaced apart in the second direction D2 at a sixth distance A4 from the third dummy electrode structure DSS3. The fifth distance A3 and the sixth distance A4 may be different from the first distance A1 and also different from the second distance A2, e.g., $A1 \neq A2 \neq A3$ and $A1 \neq A2 \neq A4$.

In some embodiments, on the connection region CNR, the second interlayer dielectric layer 70 may be provided thereon with lower connection lines LCL extending in the first direction D1. For example, the lower connection lines LCL may be located at the same level as that of the subsidiary lines SBL of the cell array region CAR. The lower connection lines LCL may have their ends coupled to corresponding top surfaces of the contact plugs CP1 to CP4. The lower connection lines LCL may be electrically connected through the contact plugs CP1 to CP4 to corresponding pad portions P1 to P4 of the electrodes ELa to ELd. In some embodiments, the lower connection lines LCL may have their line widths less than widths of the contact plugs CP1 to CP4 and widths of the dummy vertical structures DVS.

Referring to FIGS. 3, 4, 5A, and 5B, connection line groups G1, G2, G3, and G4 may be correspondingly disposed between the first to fourth rows R1 to R4 of the first to fourth contact plugs CP1 to CP4. Each of the connection line groups G1 to G4 may include two or more lower connection lines LCL extending in the first direction D1. In each of the connection line groups G1 to G4, the lower connection lines LCL may be arranged at a pitch. For example, in each of the connection line groups G1 to G4, the lower connection lines LCL may be spaced apart in the second direction D2 at a first spacing S1.

When viewed in plan, each of the connection line groups G1 to G4 may be spaced apart in the second direction D2 at a second spacing S2 from an adjacent one of the contact plugs CP1 to CP4. The second spacing S2 may be substantially equal to or greater than the first spacing S1.

For example, a first connection line group G1 may be disposed between the first row R1 of the first contact plugs CP1 and the second row R2 of the second contact plugs CP2, and a second connection line group G2 may be disposed between the second row R2 of the second contact plugs CP2 and the third row R3 of the third contact plugs CP3. A third connection line group G3 may be disposed between the third row R3 of the third contact plugs CP3 and the fourth row R4 of the fourth contact plugs CP4. Each of the first to third connection line groups G1, G2, and G3 may include three or more lower connection lines LCL.

Fourth connection line groups G4 may be disposed between the fourth rows R4 of the fourth contact plugs CP4 connected to the electrode structures EST different from each other, and between the first rows R1 of the first contact plugs CP1 connected to the electrode structures EST different from each other. Each of the fourth connection line groups G4 may include two or more lower connection lines LCL.

Bit lines BL may be disposed on a third interlayer dielectric layer 80 of the cell array region CAR, and upper connection lines UCL may be disposed on the third interlayer dielectric layer 80 of the connection region CNR. The bit lines BL may extend in the second direction D2 while running across the electrode structures EST, and may be electrically connected through second bit line contact plugs BPLG2 to the subsidiary lines SBL.

The upper connection lines UCL may extend in the first direction D1, and may be arranged at a pitch less than that between the lower connection lines LCL. The upper connection lines UCL may be electrically connected to electrodes on an upper portion of the electrode structure EST.

Figure 8:
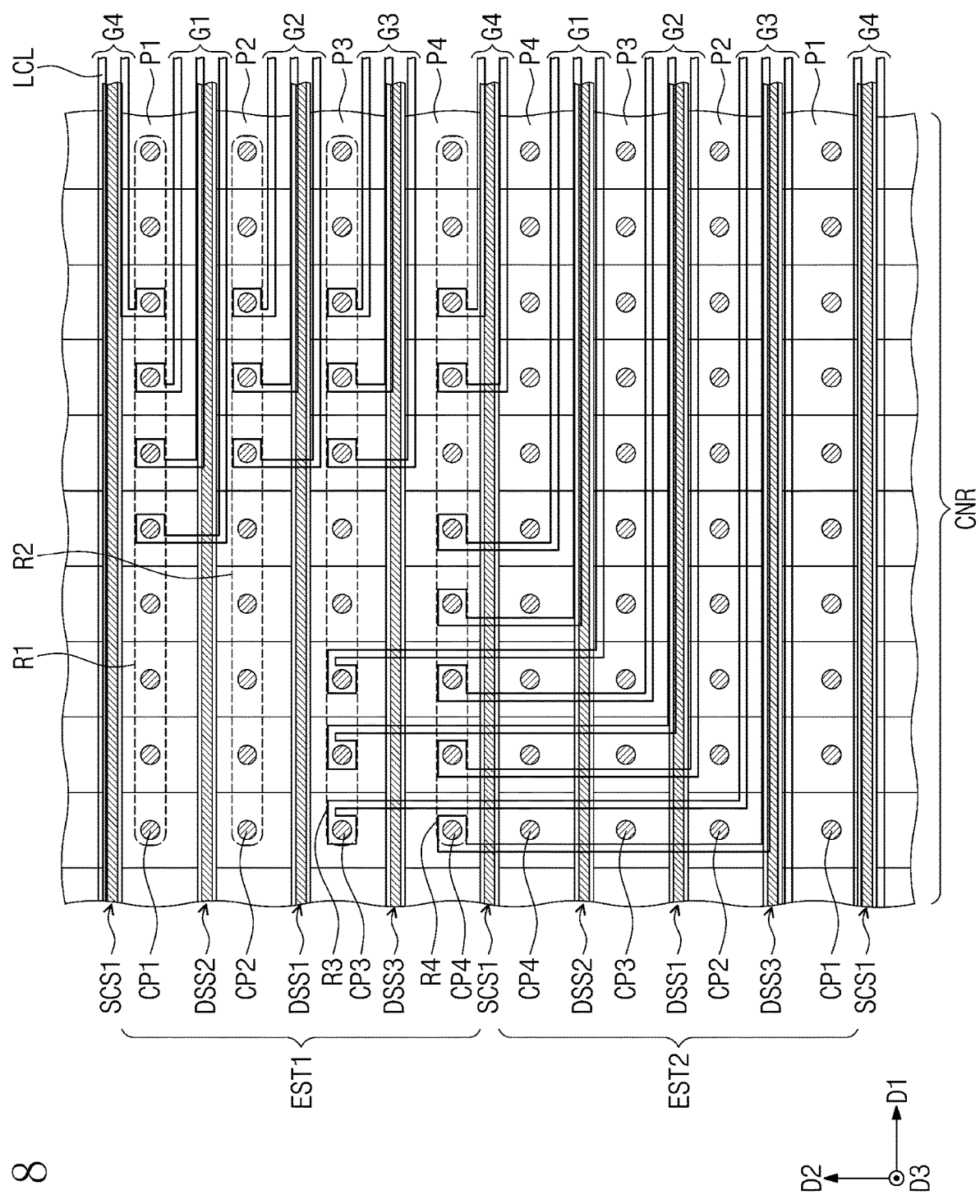
FIGS. 8 and 9 illustrate plan views partially showing a connection region of a three-dimensional semiconductor memory device according to some example embodiments of the present inventive concepts.
Figure 9:
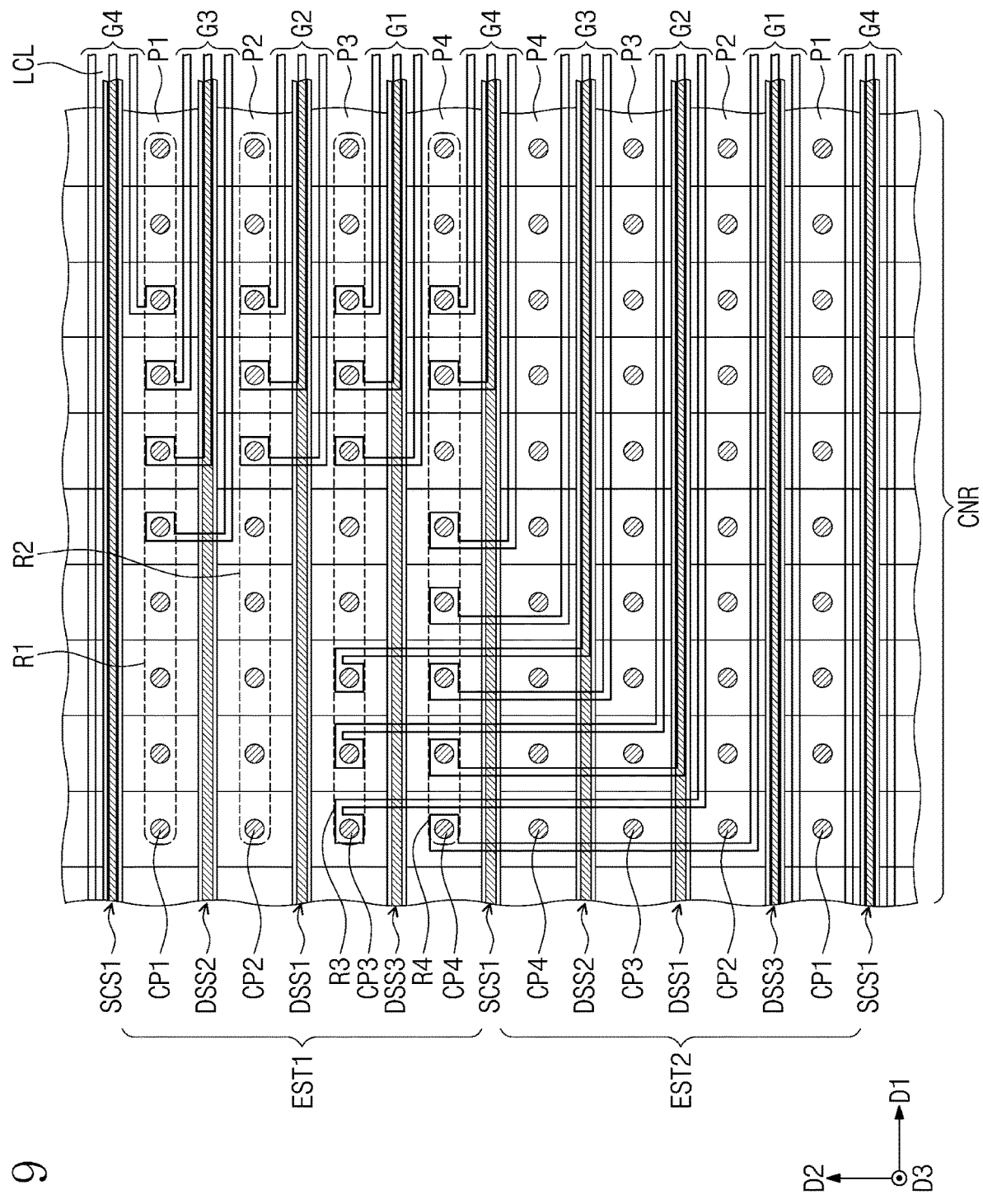

FIGS. 8 and 9 illustrate plan views partially showing a connection region of a three-dimensional semiconductor memory device according to some example embodiments of the present inventive concepts. Technical features the same as those of the three-dimensional semiconductor memory device discussed with reference to FIGS. 2 to 7B may be omitted for brevity of description.

Referring to FIGS. 8 and 9, a three-dimensional semiconductor memory device according to some example embodiments of the present inventive concepts may include first and second electrode structures EST1 and EST2. Each of the first and second electrode structures EST1 and EST2 may be disposed between a pair of the first electrode separation structures SCS1.

On the connection region CNR, the dummy electrode separation structures DSS1, DSS2, and DSS3 may penetrate each of the first and second electrode separation structures EST1 and EST2. The dummy electrode separation structures DSS1, DSS2, and DSS3 may extend in the first direction D1 between a pair of the first electrode separation structures SCS1.

Each of the first and second electrode structures EST1 and EST2 may include the first to fourth electrodes (see ELa to ELd of FIG. 2) that are sequentially and repeatedly stacked as discussed above, and the first to fourth electrodes (see ELa to ELd of FIG. 2) may include respective first to fourth pad portions P1 to P4 on the connection region CNR.

In each of the first and second electrode structures EST1 and EST2, the first to fourth pad portions P1 to P4 of the first to fourth electrodes (see ELa to ELd of FIG. 2) may be sequentially arranged along the second direction D2. The first to fourth pad portions P1 to P4 of the first electrode structure EST1 may be disposed mirror-symmetrically to the first to fourth pad portions P1 to P4 of the second electrode structure EST2.

In each of the first and second electrode structures EST1 and EST2, the contact plugs CP1 to CP4 may be correspondingly coupled to the first to fourth pad portions P1 to P4 of the first to fourth electrodes (see ELa to ELd of FIG. 2). For example, the contact plugs CP1 to CP4 may constitute rows R1 to R4 each extending along the first direction D1 and also constitute columns each extending along the second direction D2 intersecting the first direction D1.

Referring to FIG. 8, as discussed above, the rows R1 to R4 of the contact plugs CP1 to CP4 may be disposed asymmetrically from the dummy electrode separation structures DSS1, DSS2, and DSS3. For example, a distance between the second row R2 and the first dummy electrode separation structure DSS1 may be different from that between the third row R3 and the first dummy electrode structure DSS1. Alternatively, referring to FIG. 9, the rows R1 to R4 of the contact plugs CP1 to CP4 may be regularly spaced apart from the dummy electrode separation structures DSS1, DSS2, and DSS3.

Although not shown in FIGS. 8 and 9, when viewed in plan, each of the contact plugs CP1 to CP4 may be surrounded by the dummy vertical structures DVS as illustrated in FIGS. 3 and 4.

Referring back to FIGS. 8 and 9, the connection line groups G1, G2, G3, and G4 may be correspondingly provided between the rows R1 to R4 of the contact plugs CP1 to CP4 that are adjacent to each other in the second directions D2. Each of the connection line groups G1 to G4 may include a plurality of the lower connection lines LCL extending in the first direction D1. Each of the lower connection lines LCL may have an end coupled to a corresponding one of the contact plugs CP1 to CP4. Ones of the lower connection lines LCL connected to the electrodes (see ELa to ELd of FIG. 2) of the first electrode structure EST1 may partially overlap the second electrode structure EST2.

Referring to FIG. 8, the connection line groups G1 to G4 may include a first connection line group G4 including two or more lower connection lines LCL and second connection line groups G1, G2, and G3 each including three or more lower connection lines LCL. Referring to FIG. 9, each of the connection line groups G1 to G4 may include three or more lower connection lines LCL, and may be spaced apart from each other at a substantially regular interval.

Figure 10:
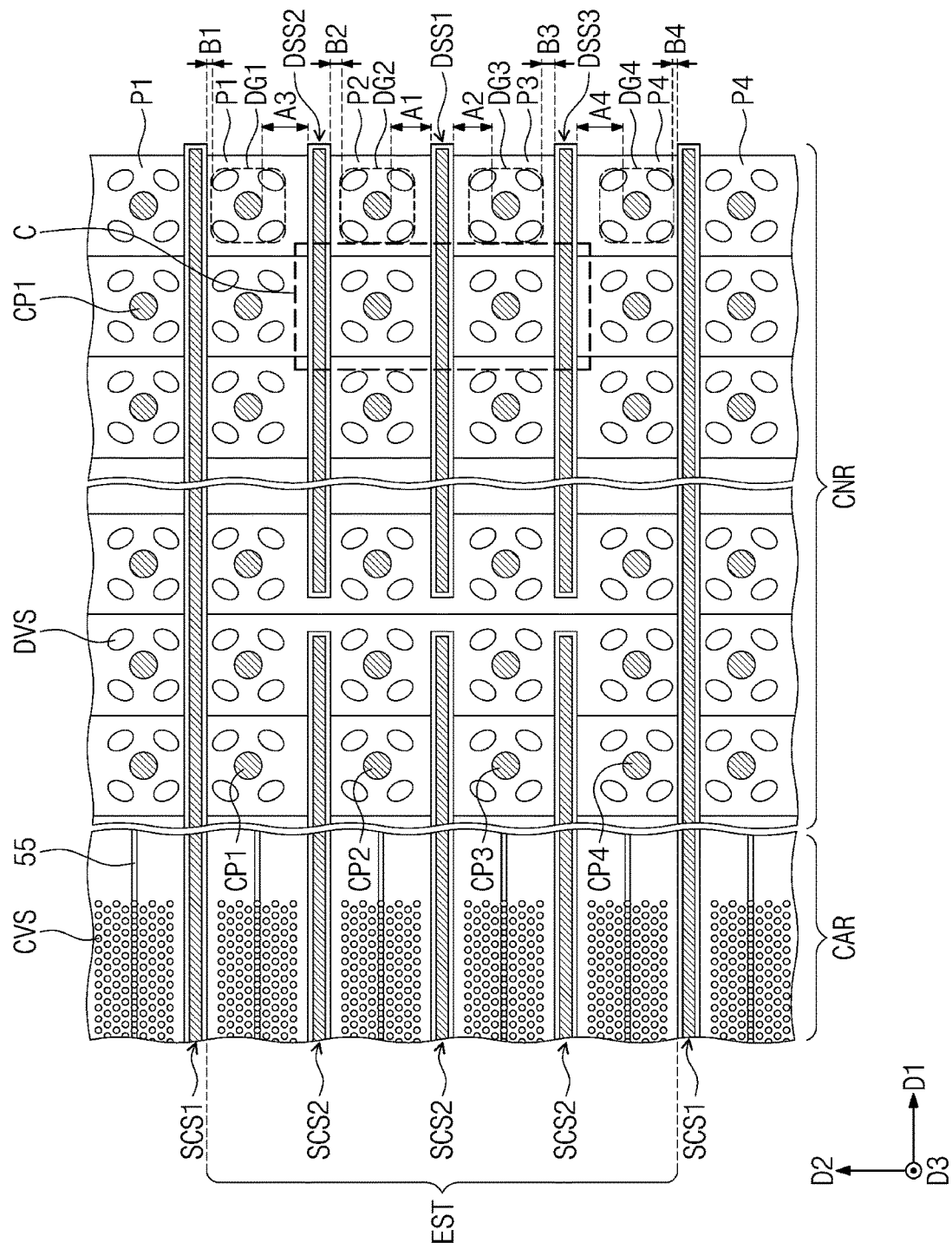
FIG. 10 illustrates a plan view showing a three-dimensional semiconductor memory device according to some example embodiments of the present inventive concepts.
Figure 11:
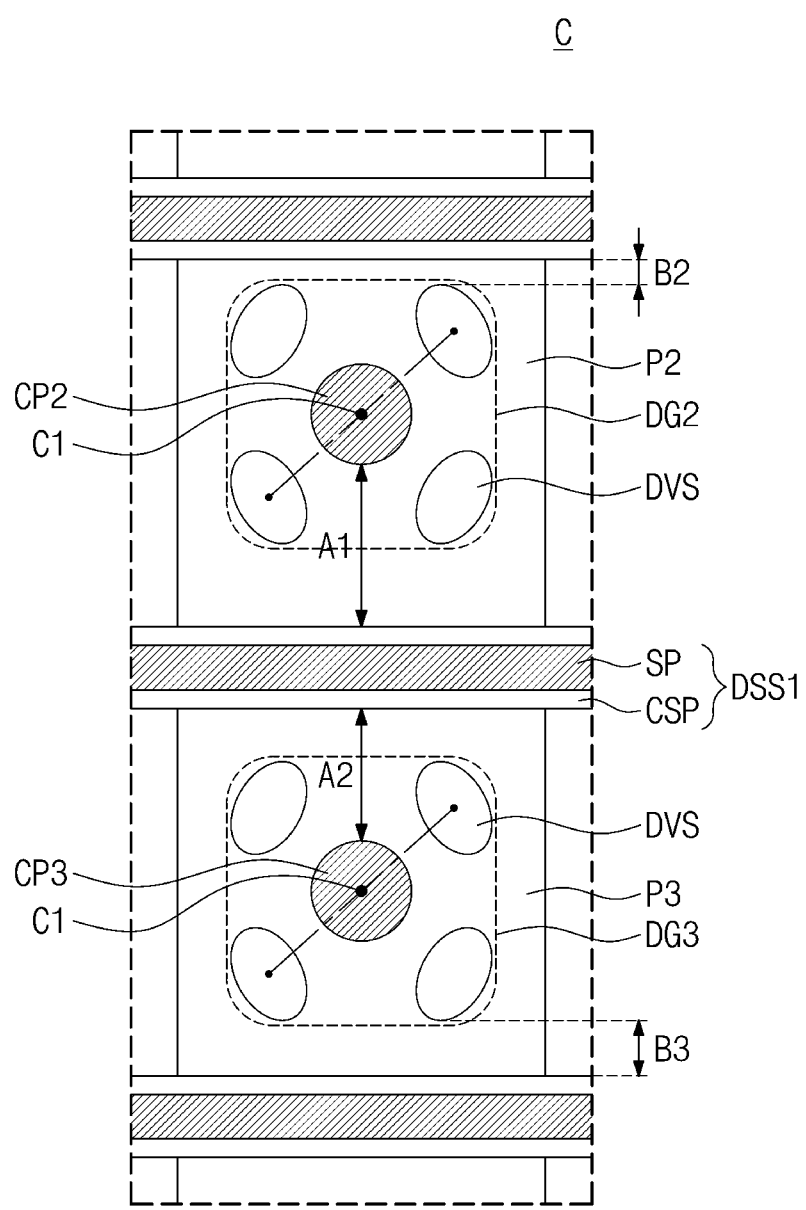
FIG. 11 illustrates an enlarged view showing section C of FIG. 10.

FIG. 10 illustrates a plan view showing a three-dimensional semiconductor memory device according to some example embodiments of the present inventive concepts. FIG. 11 illustrates an enlarged view showing section C of FIG. 10.

Referring to FIGS. 10 and 11, a three-dimensional semiconductor memory device may include the connection region CNR, on which the dummy vertical structures DVS may penetrate each of the pad portions P1 to P4 of the electrodes (see ELa to ELd of FIG. 2) and the contact plugs CP1 to CP4 may be coupled to corresponding pad portions P1 to P4 of the electrodes (see ELa to ELd of FIG. 2).

One of the contact plugs CP1 to CP4 and four dummy vertical structures DVS surrounding the one contact plug may constitute one of dummy groups DG1, DG2, DG3, and DG4, and each of the dummy groups DG1 to DG4 may be provided on a corresponding one of the pad portions P1 to P4 of the electrodes (see ELa to ELd of FIG. 2). For example, first dummy groups DG1 may be provided on corresponding first pad portions P1 of the first electrodes (see ELa of FIG. 2), and second dummy groups DG2 may be provided on corresponding second pad portions P2 of the second electrodes (see ELb of FIG. 2). Third dummy groups DG3 may be provided on corresponding third pad portions P3 of the third electrodes (see ELc of FIG. 4), and fourth dummy groups DG4 may be provided on corresponding fourth pad portions P4 of the fourth electrodes (see ELd of FIG. 2). As discussed above, because the first to fourth pad portions P1 to P4 are sequentially arranged along the second direction D2, the first to fourth dummy groups DG1 to DG4 may also be sequentially arranged along the second direction D2.

Referring to FIG. 11, in each of the first to fourth dummy groups DG1 to DG4, a single one of the contact plugs CP1 to CP4 may be positioned on the central point C1 spaced at the same distance from the dummy vertical structures DVS diagonally disposed across the single one of the contact plugs CP1 to CP4. For example, each of the contact plugs CP1 to CP4 may be placed at substantially the same distance from four dummy vertical structures DVS.

The first to fourth dummy groups DG1 to DG4 may be spaced apart at different distances from the dummy electrode separation structures DSS1, DSS2, and DSS3, e.g., B1≠B2≠B3 and B1≠B2≠B4. The second contact plugs CP2 of the second dummy groups DG2 may be spaced apart in the second direction D2 at a first distance A1 from the first dummy electrode separation structure DSS1. The third contact plugs CP3 of the third dummy groups DG3 may be spaced apart in the second direction D2 at a second distance A2 from the first dummy electrode separation structure DSS1. The first distance A1 may be different from the second distance A2. The first contact plugs CP1 of the first dummy groups DSS1 may be spaced apart in the second direction D2 at a fifth distance A3 from the second dummy electrode separation structure DSS2, and the fourth contact plugs CP4 of the fourth dummy groups DG4 may be spaced apart in the second direction D2 at a sixth distance A4 from the third dummy electrode separation structure DSS3.

Figure 12:
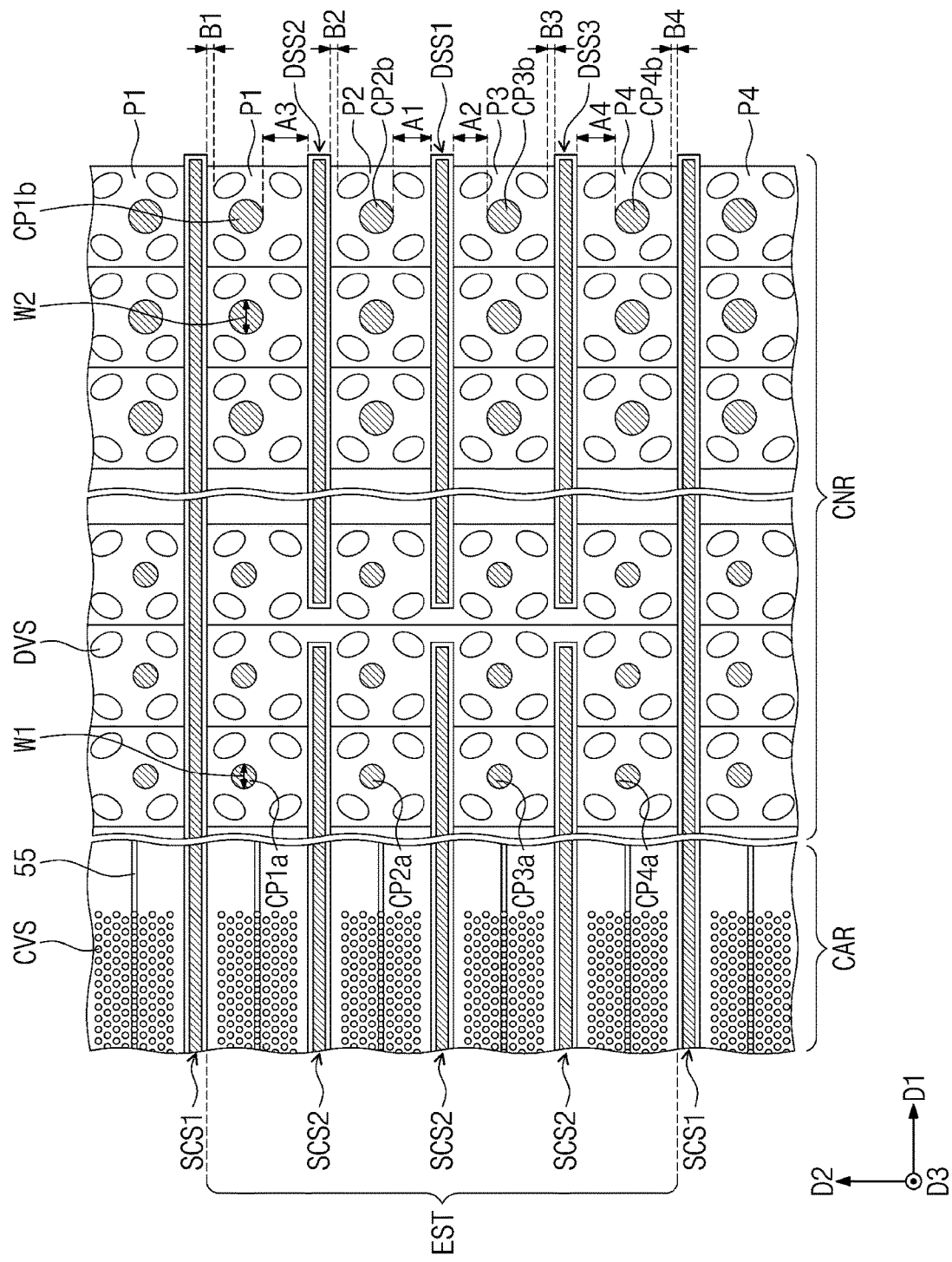
FIGS. 12, 13, and 14 illustrate plan views showing a three-dimensional semiconductor memory device according to some example embodiments of the present inventive concepts.
Figure 13:
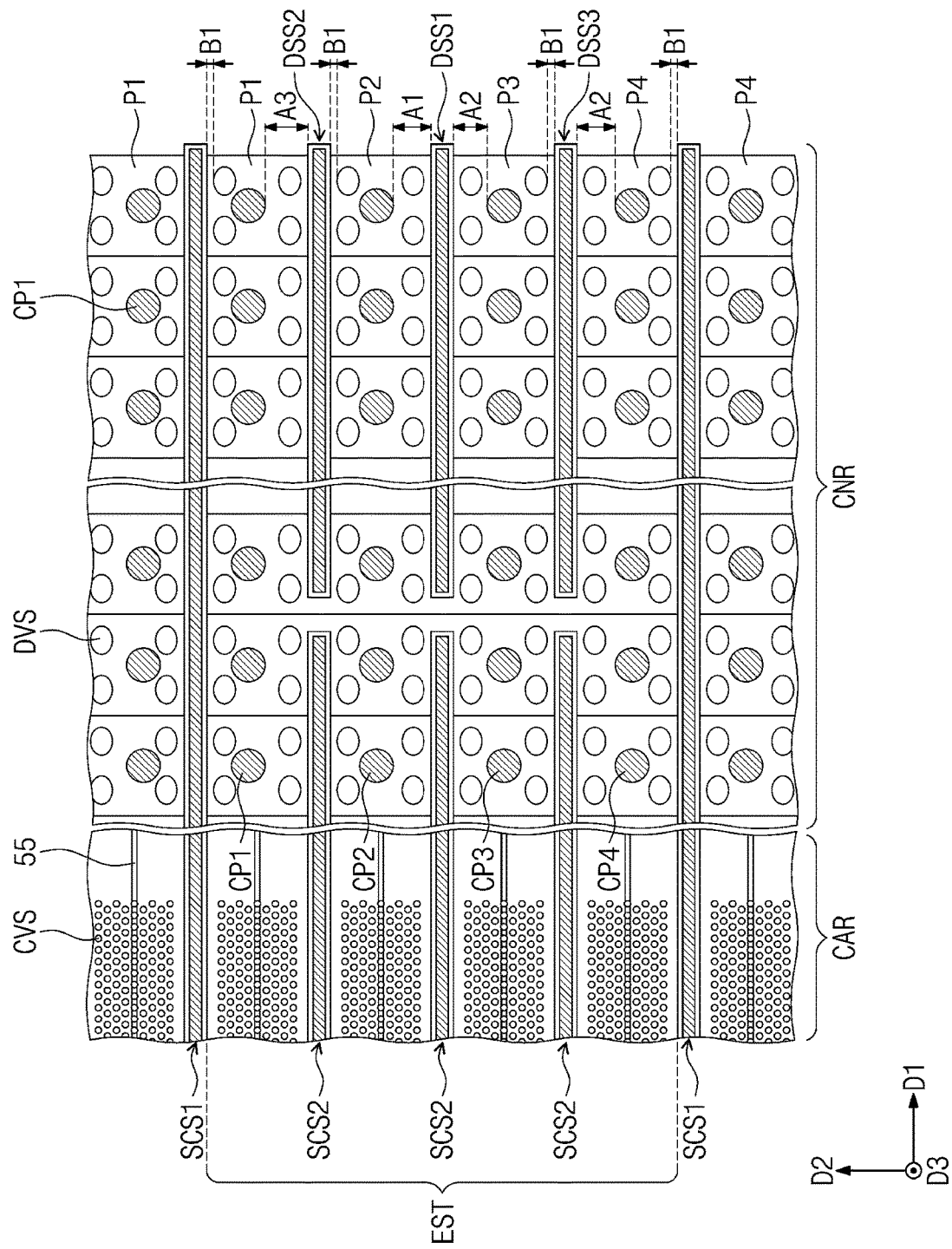
Figure 14:
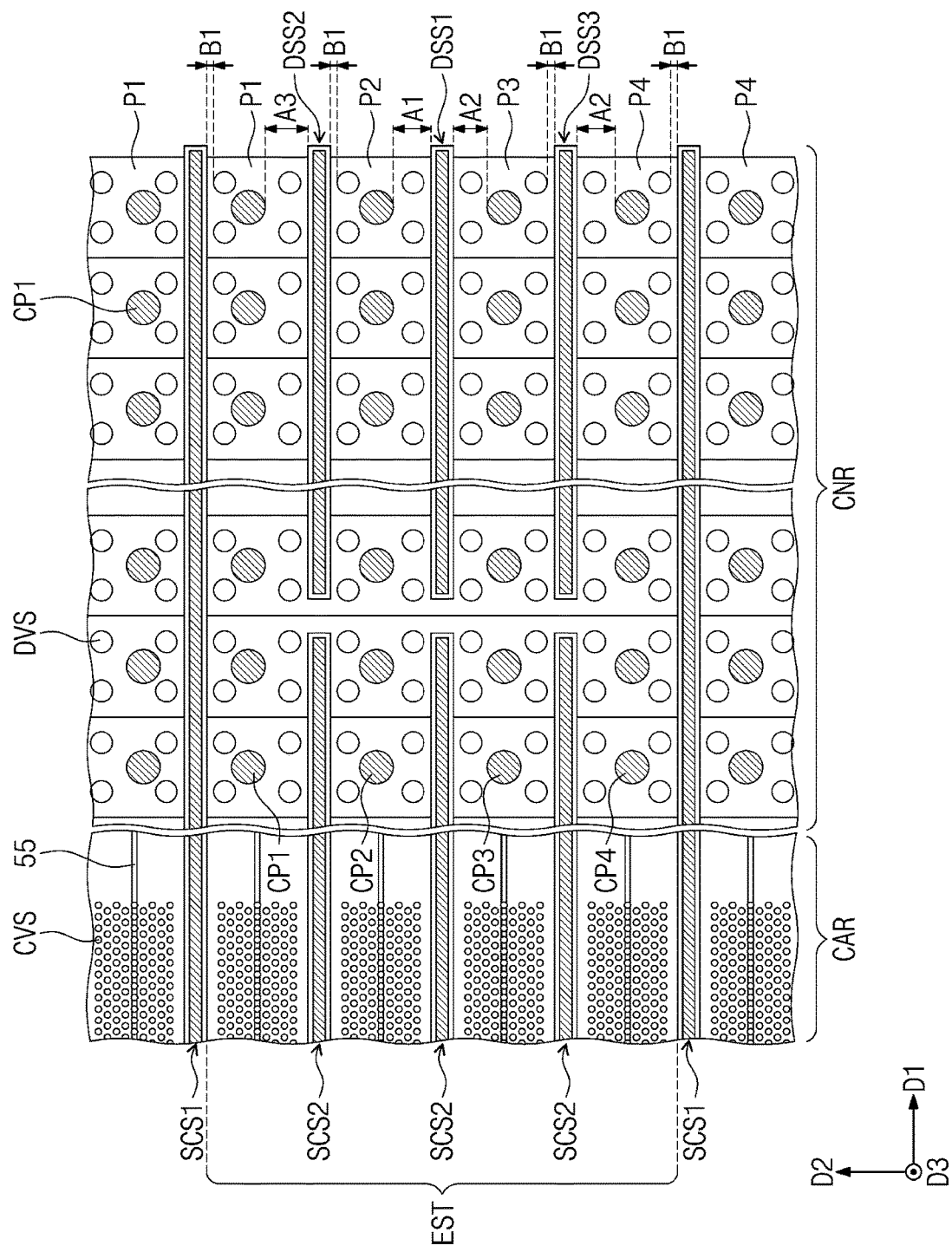

FIGS. 12, 13, and 14 illustrate plan views showing a three-dimensional semiconductor memory device according to some example embodiments of the present inventive concepts. Technical features the same as those of the three-dimensional semiconductor memory device discussed with reference to FIGS. 2 to 7B may be omitted for brevity of description, and a difference thereof will be discussed below.

Referring to FIG. 12, a three-dimensional semiconductor memory device may include first contact plugs CP1a and CP1b coupled to the first pad portions P1 of the first electrodes (see ELa of FIG. 2), second contact plugs CP2a and CP2b coupled to the second pad portions P2 of the second electrodes (see ELb of FIG. 2), third contact plugs CP3a and CP3b coupled to the third pad portions P3 of the third electrodes (see ELc of FIG. 2), and fourth contact plugs CP4a and CP4b coupled to the fourth pad portions P4 of the fourth electrodes (see ELd of FIG. 2).

The first contact plugs CP1a and CP1b may include first upper contact plugs CP1a on upper ones of the first electrodes (see ELa of FIG. 2) and first lower contact plugs CP1b on lower ones of the first electrodes (see ELa of FIG. 2). For example, when viewed in plan, the first upper contact plugs CP1a may be close to the cell array region CAR, and the first lower contact plugs CP1b may be farther away than the first upper contact plugs CP1a from the cell array region CAR. The first upper contact plugs CP1a may each have a first width W1, and the first lower contact plugs CP1b may each have a second width W2 greater than the first width W1.

Likewise the first contact plugs CP1a and CP1b, the second contact plugs CP2a and CP2b, the third contact plugs CP3a and CP3b, and the fourth contact plugs CP4a and CP4b may each include lower and upper contact plugs having different widths.

Alternatively, the first to fourth contact plugs CP1 to CP4 may have their widths that gradually increase with increasing vertical lengths thereof.

Referring to FIG. 13, the dummy vertical structures DVS surrounding a corresponding one of the contact plugs CP1 to CP4 may have their oval top surfaces whose major axes extend parallel to the first direction D1.

Referring to FIG. 14, the dummy vertical structures DVS may have their circular top surfaces whose widths are less than those of the contact plugs CP1 to CP4.

Figure 15:
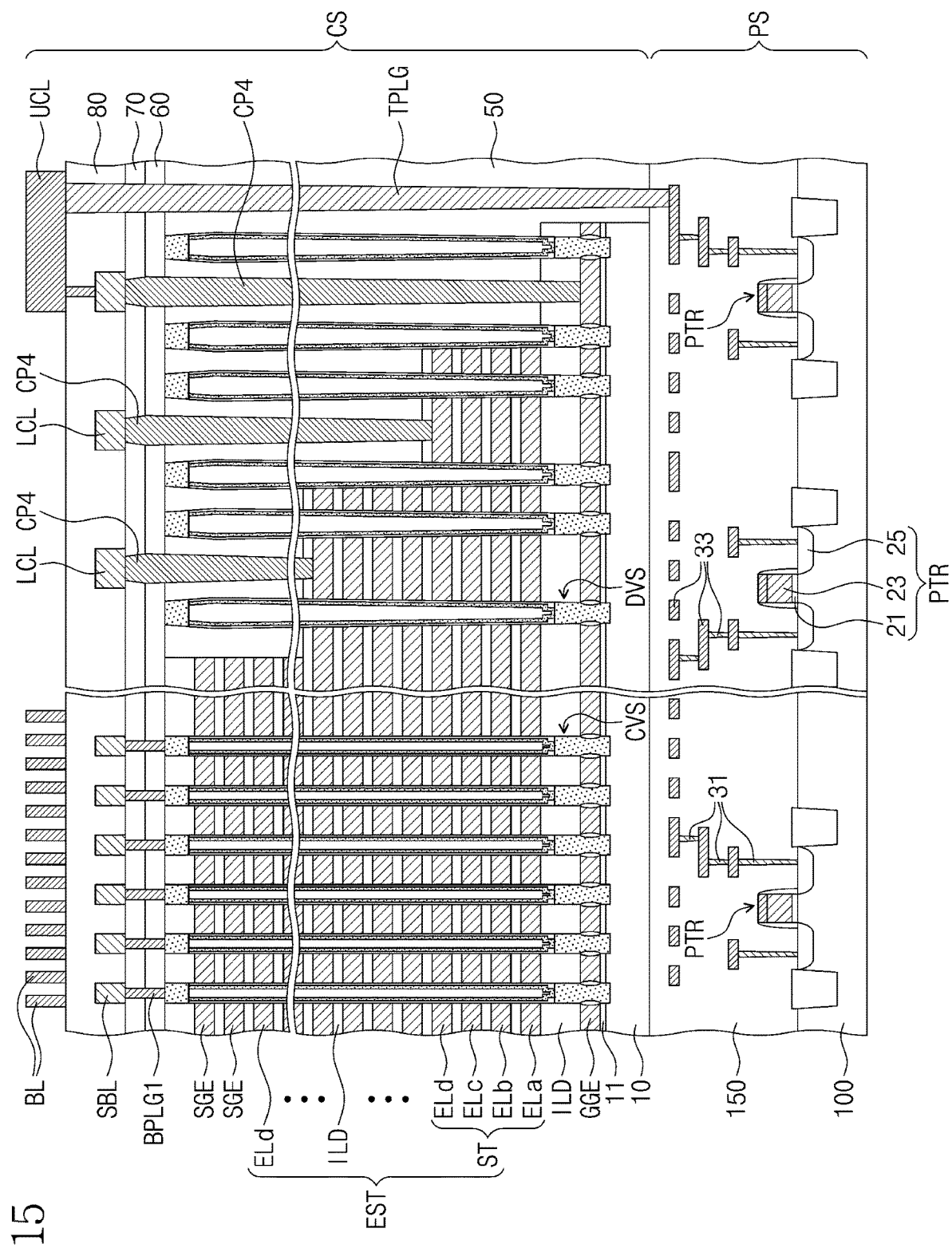
FIG. 15 illustrates a cross-sectional view showing a three-dimensional semiconductor memory device according to some example embodiments of the present inventive concepts.

FIG. 15 illustrates a cross-sectional view showing a three-dimensional semiconductor memory device according to some example embodiments of the present inventive concepts. Technical features the same as those of the three-dimensional semiconductor memory device discussed with reference to FIGS. 2 to 7B may be omitted for brevity of description, and a difference thereof will be discussed below.

Referring to FIG. 15, a three-dimensional semiconductor memory device according to some embodiments of inventive concepts may include a peripheral logic structure PS on a semiconductor substrate 100, a cell array structure CS on the peripheral logic structure PS, and/or through plugs TPLG that penetrate a portion of the cell array structure CS and connect the cell array structure CS to the peripheral logic structure PS.

For example, the peripheral logic structure PS may include peripheral logic circuits PTR integrated on an entire surface of the semiconductor substrate 100 and also include a lower dielectric layer 150 covering the peripheral logic circuits PTR.

The semiconductor substrate 100 may be a bulk silicon substrate, a silicon-on-insulator (SOI) substrate, a germanium substrate, a germanium-on-insulator (GOI) substrate, a silicon-germanium substrate, or a substrate of a thin epitaxial layer obtained by performing a selective epitaxial growth (SEG). The semiconductor substrate 100 may include n-type and p-type well impurity regions (not shown) and a device isolation layer defining active regions.

The peripheral logic circuits PTR may be row and column decoders, a page buffer, a control circuit, etc., and may include NMOS and PMOS transistors, low-voltage and high-voltage transistors, and/or a resistor that are integrated on the semiconductor substrate 100. For example, the peripheral logic circuits PTR may include a peripheral gate dielectric layer 21 on the semiconductor substrate 100, a peripheral gate electrode 23 on the peripheral gate dielectric layer 21, and/or source/drain regions 25 on opposite sides of the peripheral gate electrode 23.

Peripheral circuit lines 33 may be electrically connected through peripheral contact plugs 31 to the peripheral logic circuits PTR. For example, the peripheral contact plugs 31 and the peripheral circuit lines 33 may be coupled to the NMOS and PMOS transistors.

The lower dielectric layer 150 may be provided on the entire surface of the semiconductor substrate 100. On the semiconductor substrate 100, the lower dielectric layer 150 may cover the peripheral logic circuits PTR, the peripheral contact plugs 31, and the peripheral circuit lines 33. The lower dielectric layer 150 may include a plurality of stacked dielectric layers. For example, the lower dielectric layer 150 may include a silicon oxide layer, a silicon nitride layer, a silicon oxynitride layer, or a low-k dielectric layer.

The cell array structure CS may be disposed on the lower dielectric layer 150. In some embodiments, the cell array structure CS may include components discussed above with reference to FIGS. 2 to 7B. For example, the cell array structure CS may include on the lower dielectric layer 150 a substrate 10, an electrode structure EST, cell and dummy vertical structures CVS and DVS, contact plugs CP1 to CP4, lower connection lines LCL, and upper connection lines UCL.

The cell array structure CS may be electrically connected via the through plugs TPLG to the peripheral logic structure PS. For example, the through plugs TPLG may electrically connect the upper connection lines UCL of the cell array structure CS to the peripheral circuit lines 33 of the peripheral logic structure PS.

According to some example embodiments of the present inventive concepts, cell contact plugs coupled to pad portions of electrodes may be spaced apart differently from an electrode separation structure, which may result in an increase in the number of lower connection lines provided between neighboring cell contact plugs. The stacking number of the electrodes connected to the lower connection lines may increase and thus three-dimensional semiconductor memory devices may have increased integration. Furthermore, a process margin may be sufficiently ensured between the cell contact plugs and the lower connection lines, and as a result, three-dimensional semiconductor memory devices may have increased reliability.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A three-dimensional semiconductor memory device, comprising:
   a substrate including a cell array region and a connection region;
   an electrode structure including a plurality of electrodes vertically stacked on the substrate, each of the electrodes having a pad portion on the connection region;
   a plurality of electrode separation structures penetrating the electrode structure, the electrode separation structures extending in a first direction and spaced apart from each other in a second direction intersecting the first direction; and
   a plurality of contact plugs coupled to the pad portions of the electrodes,
   wherein the contact plugs comprise:
      a plurality of first contact plugs along the first direction; and
      a plurality of second contact plugs apart in the second direction from the first contact plugs,
   wherein the electrode separation structures comprise:
      a first electrode separation structure between the first contact plugs and the second contact plugs;
      a second electrode separation structure apart from the first electrode separation structure in the second direction, the first contact plugs between the first and second electrode separation structures; and
      a third electrode separation structure apart from the first electrode separation structure in the second direction, the second contact plugs between the first and third electrode separation structures,
   wherein the first contact plugs are apart in the second direction at a first distance from the first electrode separation structure, and apart from the second electrode separation structure at a second distance less than the first distance, and
   wherein the second contact plugs are apart in the second direction from the first electrode separation structure at a third distance different from the first distance, and apart from the third electrode separation structure at a fourth distance less than the third distance.

2. The three-dimensional semiconductor memory device of claim 1, wherein each of the pad portions of the electrodes is between the electrode separation structures adjacent to each other in the second direction.

3. The three-dimensional semiconductor memory device of claim 1, wherein
   top surfaces of the first and second contact plugs are at the same level, and
   bottom surfaces of the first and second contact plugs are at different levels.

4. The three-dimensional semiconductor memory device of claim 1, wherein the contact plugs further comprise a plurality of third contact plugs apart in the second direction from the second contact plugs,
   wherein the second electrode separation structure is between the second contact plugs and the third contact plugs, and
   wherein the third contact plugs are apart in the second direction from the second electrode separation structure at a fifth distance, different from the third distance.

5. The three-dimensional semiconductor memory device of claim 4, wherein the fifth distance is different from the first distance.

6. The three-dimensional semiconductor memory device of claim 1, further comprising a plurality of dummy vertical structures on the connection region, the dummy vertical structures penetrating corresponding pad portions of the electrodes and when viewed in plan being disposed to surrounding a corresponding one of the contact plugs,
   wherein the dummy vertical structures have a major axis in a diagonal direction to the first and second directions.

7. The three-dimensional semiconductor memory device of claim 1, further comprising a plurality of dummy vertical structures on the connection region, the dummy vertical structures penetrating corresponding pad portions of the electrodes and when viewed in plan being disposed to surround a corresponding one of the contact plugs,
   wherein each of the contact plugs deviates from a central point spaced at the same distance from the dummy vertical structures that are diagonally across the each of the contact plugs.

8. The three-dimensional semiconductor memory device of claim 1, further comprising:
an interlayer dielectric layer on top surfaces of the first and second contact plugs; and
a connection line group in the interlayer dielectric layer and includes a plurality of lower connection lines extending in the first direction,
wherein, when viewed in plan, the connection line group is between the first contact plugs and the second contact plugs.

9. A three-dimensional semiconductor memory device, comprising:
a substrate including a cell array region and a connection region;
an electrode structure including a plurality of electrodes vertically stacked on the substrate, each of the electrodes having a pad portion on the connection region;
an electrode separation structure penetrating the electrode structure and extending in a first direction;
a plurality of contact plugs coupled to corresponding pad portions of the electrodes, the contact plugs including a first contact plug and a second contact plug apart in a second direction intersecting the first direction, the electrode separation structure between the first contact plug and the second contact plug, and the plurality of electrodes being vertically stacked in a third direction intersecting the first and second directions; and
a connection line group between the first contact plug and the second contact plug, the connection line group including a plurality of lower connection lines that extend in the first direction,
wherein the first contact plug is apart in the second direction at a first distance from the electrode separation structure, and
wherein the second contact plug is apart from the electrode separation structure at a second distance, different from the first distance.

10. The three-dimensional semiconductor memory device of claim 9, wherein the contact plugs have a width greater than a line width of the lower connection lines.

11. The three-dimensional semiconductor memory device of claim 9, further comprising:
an interlayer dielectric layer on the contact plugs; and
a plurality of upper connection lines on the interlayer dielectric layer,
wherein the lower connection lines are between the contact plugs and the upper connection lines.

12. The three-dimensional semiconductor memory device of claim 11, wherein bottom surfaces of the lower connection lines are at the same level as that of top surfaces of the contact plugs.

13. The three-dimensional semiconductor memory of claim 9, wherein
top surfaces of the first and second contact plugs are at the same level, and
bottom surfaces of the first and second contact plugs are at different levels.

14. The three-dimensional semiconductor memory device of claim 9, wherein the pad portions of the electrodes are correspondingly between the electrode separation structures adjacent to each other in the second direction.

15. A three-dimensional semiconductor memory device, comprising:
a substrate including a cell array region and a connection region;
an electrode structure including a plurality of electrodes that are vertically stacked on the substrate, the electrode structure having on the connection region a plurality of first pad portions and a plurality of second pad portions;
a plurality of first contact plugs along a first direction and coupled to corresponding first pad portions;
a plurality of second contact plugs coupled to corresponding second pad portions and apart in a second direction from the first contact plugs, the second direction intersecting the first direction;
an electrode separation structure penetrating the electrode structure and extending along the first direction between the first contact plugs and the second contact plugs;
a plurality of first dummy vertical structures penetrating corresponding first pad portions between the electrode separation structure and the first contact plugs; and
a plurality of second dummy vertical structures penetrating corresponding second pad portions between the electrode separation structure and the second contact plugs,
wherein the first and second dummy vertical structures are apart in the second direction at a first distance from the electrode separation structure,
wherein the first contact plugs are apart in the second direction at a second distance from the electrode separation structure, and
wherein the second contact plugs are apart in the second direction from the second electrode separation structure at a third distance, different from the second distance.

16. The three-dimensional semiconductor memory device of claim 15, further comprising a connection line group between the first contact plugs and the second contact plugs,
wherein the connection line group comprises a plurality of lower connection lines extending in the first direction.

17. The three-dimensional semiconductor memory device of claim 16, further comprising:
an interlayer dielectric layer on top surfaces of the first and second contact plugs; and
a plurality of upper connection lines on the interlayer dielectric layer,
wherein the lower connection lines are between the upper connection lines and the first contact plugs and between the upper connection lines and the second contact plugs.

18. The three-dimensional semiconductor memory device of claim 16, wherein
the first and second dummy vertical structures have a first width greater than a line width of the lower connection lines, and
the first and second contact plugs have a second width greater than the first width.

19. The three-dimensional semiconductor memory device of claim 15, wherein top surfaces of the first and second dummy vertical structures are at a lower level than that of top surfaces of the first and second contact plugs.

20. The three-dimensional semiconductor memory device of claim 15, wherein the first and second contact plugs are spaced apart differently in the second direction from the electrode separation structure.

* * * * *